(12) United States Patent
Kajita et al.

(10) Patent No.: US 6,180,316 B1
(45) Date of Patent: Jan. 30, 2001

(54) RADIATION SENSITIVE RESIN COMPOSITION

(75) Inventors: Toru Kajita; Mitsuhito Suwa; Haruo Iwasawa; Masafumi Yamamoto, all of Mie (JP)

(73) Assignee: JSR Corporation, Tokyo (JP)

( * ) Notice: Under 35 U.S.C. 154(b), the term of this patent shall be extended for 0 days.

(21) Appl. No.: 09/231,762

(22) Filed: Jan. 15, 1999

(30) Foreign Application Priority Data

Jan. 16, 1998 (JP) .................................................. 10-018290
Jan. 16, 1998 (JP) .................................................. 10-018291
Sep. 25, 1998 (JP) .................................................. 10-270685

(51) Int. Cl.[7] .................................................. G03F 7/004
(52) U.S. Cl. ........................ 430/270.1; 430/905; 430/910
(58) Field of Search ............................... 430/270.1, 905, 430/910

(56) References Cited

U.S. PATENT DOCUMENTS 5,310,619 * 5/1994 Crivello et al. .................... 430/270.1
5,786,131 * 7/1998 Allen et al. ........................... 430/325
5,843,624 * 12/1998 Houlihan et al. .................... 430/296

FOREIGN PATENT DOCUMENTS 0 422 628   4/1991   (EP) .
0 690 348   1/1996   (EP) .
0 789 278   8/1997   (EP) .
WO 97/33198   9/1997   (WO) .

OTHER PUBLICATIONS

M–Y. LI, et al., Journal of Imaging Science, vol. 34, No. 6, pp. 259–264, "Imaging by Photodecoupling of Crosslinks in Polymer Gels", Nov./Dec. 1990.

* cited by examiner

Primary Examiner—John S. Chu
(74) Attorney, Agent, or Firm—Oblon, Spivak, McClelland, Maier & Neustadt, P.C.

(57) ABSTRACT

A radiation-sensitive resin composition which comprises,
(A) a polymer containing,
(a) a recurring unit (I) of the following formula (1):

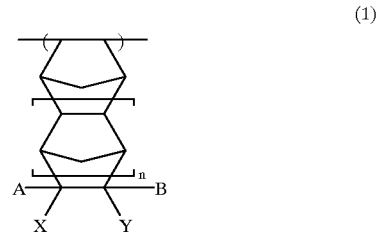

or a recurring unit (I) of the formula (1) and a recurring unit (II) of the following formula (2),

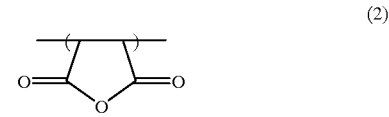

and
(b) a recurring unit (III) which is derived from a monomer having at least two polymerizable carbon—carbon double bonds by cleavage of the carbon—carbon double bonds, wherein the monomer has, in addition to said at least two polymerizable carbon—carbon double bonds, at least one acid-decomposable divalent group of the following formula (3) or (4),

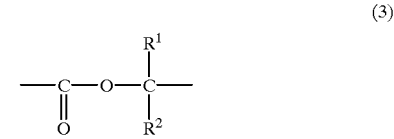

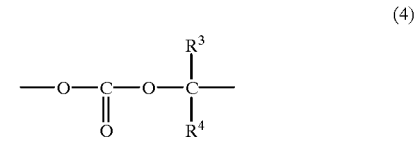

said at least two polymerizable carbon—carbon double bonds being linked via the least one acid-decomposable divalent group of the formula (3) or (4), and
(B) a photoacid generator.

21 Claims, No Drawings

RADIATION SENSITIVE RESIN COMPOSITION

BACKGROUND OF THE INVENTION

1. Field of the Invention

The present invention relates to a radiation sensitive resin composition, and more specifically, to a radiation sensitive resin composition suitable for use as a chemically amplified resist.

2. Description of Background Art

In the field of microfabrication, as exemplified by the manufacturing of an integrated circuit device, development of a lithographic process capable of performing microfabrication with a 0.2 μm or less line-width precision has been vigorously pursued in recent years to achieve higher integration.

To ensure microfabrication in the order of 0.2 μm or less, the use of short wavelength radioactive rays is being studied. As such short wavelength radioactive rays, far ultraviolet rays, X-rays, and electron beams, typified by a bright-line spectrum of mercury-vapor light and an excimer laser, can be given. Of these, a KrF excimer laser (wavelength: 248 nm) and an ArF excimer laser (wavelength: 193 nm) are regarded as promising.

A number of compositions utilizing a chemical amplification effect of a component which has an acid-decomposable functional group and a component which generates an acid when irradiated with radioactive rays have been proposed as radiation-sensitive resin compositions applicable to irradiation by such excimer lasers. Such a composition is hereinafter called "a chemically amplified radiation sensitive composition" and such a component which generates an acid when irradiated with radioactive rays is hereinafter called "an acid generator".

For example, Japanese Patent Publication No. 27660/1990 discloses a chemically amplified radiation sensitive composition comprising a polymer having a t-butyl ester group of carboxylic acid or a t-butyl carbonate group of phenol and an acid generator. The t-butyl ester group or t-butyl carbonate group in the polymer dissociates by the action of the acid which is generated by irradiation of radioactive rays. As a consequence, the polymer has an acidic group consisting of a carboxyl group or phenolic hydroxyl group, which makes the irradiatied areas on the resist film easily soluble in an alkaline developer.

Most conventional chemically amplified radiation sensitive compositions contain a phenol-type base resin. When deep ultraviolet rays are used with such a resin, part of the deep ultraviolet rays is absorbed by the aromatic ring in the resin, so that a sufficient amount of the deep ultraviolet rays cannot reach the deepest part of the resist film. The irradiation dose is larger at the resist film surface than the resist film. As a consequence, in the case of positive working resists, the resist pattern after development which is smaller around the surface parts increases progressively toward the bottom. No sufficient resolution can be obtained. In addition, if a resist pattern after development provides a trapezoid section, no desired dimensional precision can be obtained in the subsequent etching and ion implantation steps. Unless the sectional configuration of the resist pattern is rectangular in the upper layer, the resist dissipates so fast by dry etching that it is difficult to control the etching conditions.

The configuration of resist pattern can be improved by increasing the transmittance of radioactive rays of the resist film. For example, a (meth)acrylate-type resin represented by poly (methyl methacrylate) exhibits a high transparency to deep ultraviolet rays. This type of resin is therefore ideal from the viewpoint of radioactive ray transmittance. Japanese Patent Application Laid-open No. 226461/1992, for example, discloses a chemically amplified radiation-sensitive resin composition comprising a methacrylate-based resin. This composition is excellent inasmuch as its performance of microfabrication is concerned. However, the composition has a drawback of a low dry etching resistance due to absence of an aromatic ring. It is difficult to perform etching with high-resolution.

In addition, a number of three or higher multi-component compositions in which high or low molecular weight additives are incorporated have been proposed as a means for improving performance of the resist comprising a chemically amplified radiation sensitive composition. However, the relationship between the radiation transmittance of resist films and the function of the additives in these compositions has not been completely clarified. In addition, these compositions do not necessarily satisfy an overall balance of important characteristics as a resist, such as dry etching resistance, pattern configuration, sensitivity, resolution, and the like. For instance, a resist composition disclosed in Japanese Patent Application Laid-open No. 15865/1997, which comprises a copolymer containing (meth)acrylate and (meth)acrylic acid as essential components, and acid generator, and androstane-17-alkyl carboxylate, has a difficulty in adequately controlling diffusion of acid in the resist film during formation of resist patterns, in spite of its high transparency to radioactive rays. The difficulty in controlling diffusion of acid not only results in unsatisfactory pattern configuration, sensitivity, and resolution, but also in poor dry etching resistance, insufficient developability, and impaired adhesive properties to substrates.

Adequate control of acid diffusion in resist films is very important for obtaining an excellent resist profile, particularly in the area where the fabricated pattern size is 0.20 μm or less. Development of a radiation-sensitive resin composition which can effectively control acid diffusion has been desired from such a point of view.

An object of the present invention is therefore to provide a radiation-sensitive resin composition useful as a chemically amplified resist which is sensitive to reactive radioactive rays such as deep ultraviolet rays, typified by a KrF excimer laser or an ArF excimer laser, for example, exhibiting high transparency to radiation, superior dry-etching resistance, high resolution, and an excellent property balance such as pattern configuration and sensitivity.

SUMMARY OF THE INVENTION

The above object can be achieved in the present invention by providing a radiation-sensitive resin composition which comprises, (A) a polymer containing,
  (a) a recurring unit (I) of the following formula (1):

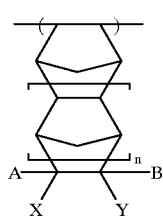

(1)

wherein A and B individually represent a hydrogen atom or an acid-decomposable organic group having 20 or less carbon atoms which dissociates in the presence of an acid and produces an acidic functional group, provided that either one of A and B is the acid-decomposable organic group, X and Y individually represent a hydrogen atom or an alkyl group having 1–4 carbon atoms, and n is 0 or 1, or a recurring unit (I) of the above formula (1) and a recurring unit (II) of the following formula (2),

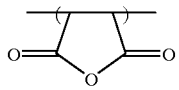

(2)

and
  (b) a recurring unit (III) which is derived from a monomer having at least two polymerizable carbon—carbon double bonds by cleavage of the carbon—carbon double bonds, wherein the monomer has, in addition to said at least two polymerizable carbon—carbon double bonds, at least one acid-decomposable divalent group of the following formula (3) or (4),

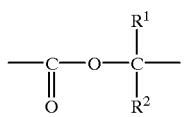

(3)

wherein $R^1$ and $R^2$ are individually an alkyl group having 1–5 carbon atoms,

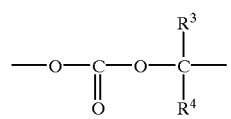

(4)

wherein $R^3$ and $R^4$ are individually an alkyl group having 1–5 carbon atoms,
  said at least two polymerizable carbon—carbon double bonds being linked via the least one acid-decomposable divalent group of the formula (3) or (4), and
(B) a photoacid generator.

This radiation sensitive resin composition is hereinafter called "a first invention".

Alternatively, the above object can be achieved by a radiation sensitive resin composition which comprises, in addition to the components for the above-described first invention, (C) an alicyclic compound having a molecular weight of 1000 or less, which has an acid-decomposable organic group producing an acid functional group in the presence of an acid.

The above object can further be achieved in the present invention by providing a radiation-sensitive resin composition which comprises, (A') a polymer containing said recurring unit (I) shown by above-mentioned formula (1),
(B') a photoacid generator, and
(C') an androstane-17-carboxylic acid ester compound of the following formula (5),

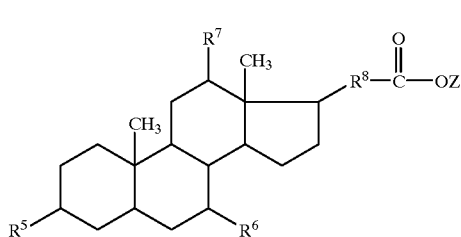

(5)

wherein $R^5$, $R^6$, and $R^7$ are individually a hydrogen atom, a hydroxyl group, an alkoxyl group having 1–4 carbon atoms, alkyl carbonyloxy group having 2–5 carbon atoms, or a haloalkyl carbonyloxy group having 2–5 carbon atoms, $R^8$ is a divalent organic group having 1–10 carbon atoms, and Z is a monovalent organic group having 20 or less carbon atoms.

This radiation sensitive resin composition is hereinafter called "a second invention".

As the recurring unit (I) of the formula (1) for the component (A') in the second invention, the same recurring unit (I) of the formula (1) for the component (A) in the first invention can be used. Similarly, as the photoacid generator of component (B') in the second invention, the same photoacid generator of the component (B) in the first invention can be used.

Other and further objects, features and advantages of the present invention will appear more fully from the following description.

DETAILED DESCRIPTION OF THE INVENTION AND PREFERRED EMBODIMENTS

I. First Invention

Component (A)

The component (A) used in the radiation sensitive resin composition is a polymer which contains (a) a recurring unit (I) of the above-described formula (1) or a recurring. unit (I) of the formula (1) and a recurring unit (II) of the above-described formula (2), and (b) a recurring unit (III) which is derived from a monomer having at least two polymerizable carbon—carbon double bonds by cleavage of the carbon—carbon double bonds, wherein the monomer has, in addition to said at least two polymerizable carbon—carbon double bonds, at least one acid-decomposable divalent group of the above-described formula (3) or (4), and wherein said at least two polymerizable carbon—carbon double bonds are linked via said at least one acid-decomposable divalent group of the formula (3) or (4). Such a polymer of the component (A) is usually a copolymer prepared from two or more monomers which provide the recurring units (I), (II), and (III), and hereinafter called "copolymer (A)" in this specification. The copolymer (A) has analicyclic skeleton on the main chain and a crosslinking structure cleavable by the action of an acid.

In the first invention, a radiation sensitive resin composition with superior properties as a resist, which include particularly superior transparency to radiations and excellent dry etching resistance, can be obtained by providing a copolymer (A) having an alicyclic skeleton on the main chain. Particularly, in order to provide the composition with superb dry etching resistance, the copolymer (A) should have a recurring unit with n=1 in the formula (1).

In addition, the copolymer (A) should preferably contains, as substituents A and/or B in the recurring unit (I), acid decomposable organic groups having 20 or less carbon atoms which generates acid functional groups by decomposition in the presence of an acid (hereinafter called acid decomposable organic group (i)).

The following groups can be given as examples of preferable acid decomposable organic group (i): (cyclo)alkoxycarbonyl groups such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, n-hexyloxycarbonyl group, n-heptyloxycarbonyl group, n-octyloxycarbonyl group, n-decyloxycarbonyl group, cyclopentyloxycarbonyl group, cyclohexyloxycarbonyl group, 4-t-butylcyclohexyloxycarbonyl groups, cycloheptyloxycarbonyl group, and cyclooctyloxycarbonyl group; aryloxycarbonyl groups such as phenoxycarbonyl group, 4-t-butylphenoxycarbonyl group, and 1-naphthyloxycarbonyl group; aralkyloxycarbonyl groups such as benzyloxycarbonyl group, 4-t-butylbenzyloxycarbonyl group, phenethyloxycarbonyl group, and 4-t-butylphenethyloxy-carbonyl group; 1-(cyclo)alkyloxyethoxycarbonyl groups such as 1-methoxyetho xycarbonyl group, 1-ethoxyethoxycarbonyl group, 1-n-propoxyethoxycarbonyl group, i-propoxyethoxycarbonyl group, n-but oxyethoxycarbonyl group, 2-methylpropoxyethoxycarbonyl group, 1-methylpropoxyethoxycarbonyl group, t-butoxyethoxycarbonyl group, 1-cyclohexyloxyethoxycarbonyl group, and 1-(4'-t-butyl cyclohexyloxy)ethoxycarbonyl group; 1-aryloxyethoxycarbonyl groups such as 1-phenoxyethoxycarbonyl group and 1-(4'-butylphenoxy) ethoxycarbonyl group; 1-aralkyloxyethoxy-carbonyl groups such as 1-benzyloxyethoxycarbonyl group and 1-(4'-butylbenzyloxy)ethoxycarbonyl group; (cyclo)alkoxycarbonylmethoxycarbonyl groups such as methoxycarbonylmethoxycarbonyl group, ethoxycarbonylmethoxycarbonyl group, n-propoxycarbonylmethoxycarbonyl group, i-propoxycarbonyl methoxycarbonyl group, n-butoxycarbonylmethoxycarbonyl group, 2-methylpropoxycarbonylmethoxycarbonyl group, 1-methylpropoxycarbonylmethoxycarbonyl group, t-butoxycarbonylmethoxycarbonyl group, cyclohexyloxycarbonyl methoxycarbonyl group, and 4-t-butylcyclohexyloxycarbonylmethoxycarbonyl group; (cyclo)alkoxycarbonylmethyl groups such as methoxycarbonyl methyl group, ethoxycarbonylmethyl group, n-propoxycarbonylmethyl group, i-propoxycarbonylmethyl group, n-butoxycarbonylmethyl group, 2-methylpropoxycarbonylmethyl group, 1-methylpropoxycarbonylmethyl group, t-butoxycarbonylmethyl group, cyclohexyloxycarbonylmethyl group, and 4-t-butylcyclohexyloxycarbonylmethyl group; aryloxycarbonylmethyl groups such as phenoxycarbonylmethyl group, 4-t-butylphenoxycarbonylmethyl group, and 1-naphthyloxycarbonylmethyl group; aralkyloxycarbonylmethyl groups such as benzyloxycarbonylmethyl group, 4-t-butylbenzyloxycarbonylmethyl group, phenethyloxycarbonylmethyl group, and 4-t-butylphenethyloxycarbonylmethyl group, 2-(cyclo)alkoxycarbonylethyl groups such as 2-methoxycarbonylethyl group, 2-ethoxycarbonylethyl group, 2-n-propoxycarbonylethyl group, 2-i-propoxycarbonylethyl group, 2-n-butoxycarbonylethyl group, 2-(2'-methylpropoxy)carbonylethyl group, 2-(1'-methylpropoxy)carbonylethyl group, 2-t-butoxycarbonylethyl group, 2-cyclohexyloxycarbonyl ethyl group, and 2-(4'-t-butylcyclohexyloxycarbonyl)ethyl group, 2-aryloxycarbonylethyl groups such as 2-phenoxycarbonylethyl group and 2-(4'-t-butylphenoxycarbonyl)ethyl group; 2-aralkyloxycarbonylethyl groups such as 2-benzyloxycarbonylethyl group and 2-(4'-t-butylbenzyloxycarbonyl)ethyl group; tetrahydrofuranyloxy carbonyl group, and tetrahydropyranyloxycarbonyl group.

Among these acid decomposable organic groups (i), the groups corresponding to —COOR' (wherein R' is a (cyclo)alkyl group with 1–19 carbon atoms) or —COOCH$_2$COOR" (wherein R" is a (cyclo) alkoxycarbonylmethyl group with 1–17 carbon atoms) are desirable. Particularly preferred groups are 1-methylpropoxycarbonyl group, t-butoxycarbonyl group, and t-butoxycarbonylmethoxycarbonyl group.

As examples of the alkyl group having 1–4 carbon atoms represented by X or Y in the recurring unit (I), methyl group, ethyl group, n-propyl group, i-propyl group, n-butyl group, 2-methylpropyl group, 1-methylpropyl group, and t-butyl group can be given.

As examples of a monomer which provides such a recurring unit (I), norbornene derivatives shown by the following formula (6) (hereinafter called "norbornene derivative (α)") can be given.

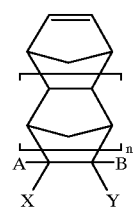

(6)

wherein A, B, X, Y, and n are the same as previously defined for the formulas (1) and (2).

The following compounds are given as specific examples of norbornene derivative (α) with n=0 in the formula (6):
5-methoxycarbonylbicyclo[2.2.1]hept-2-ene,
5-ethoxycarbonylbicyclo[2.2.1]hept-2-ene,
5-n-propoxycarbonylbicyclo[2.2.1]hept-2-ene,
5-i-propoxycarbonylbicyclo[2.2.1]hept-2-ene,
5-n-butoxycarbonylbicyclo[2.2.1]hept-2-ene,
5-(2'-methylpropoxy)carbonylbicyclo[2.2.1]hept-2-ene,
5-(1'-methylpropoxy)carbonylbicyclo[2.2.1]hept-2-ene,
5-t-butoxycarbonylbicyclo[2.2.1]hept-2-ene, 5-cyclohexyloxycarbonylbicyclo[2.2.1]hept-2-ene,
5-(4'-t-butylcyclohexyloxy)carbonylbicyclo[2.2.1]hept-2-ene,
5-phenoxycarbonylbicyclo[2.2.1]hept-2-ene,
5-(1'-ethoxyethoxy)carbonylbicyclo[2.2.1]hept-2-ene,
5-(1'-cyclohexyloxyethoxy)carbonylbicyclo[2.2.1]hept-2-ene,
5-t-butoxycarbonylmethoxycarbonylbicyclo[2.2.1]hept-2-ene,
5-tetrahydrofuranyloxycarbonylbicyclo[2.2.1]hept-2-ene,
5-tetrahydropyranyloxycarbonylbicyclo[2.2.1]hept-2-ene,
5-methyl-5-methoxycarbonylbicyclo[2.2.1]hept-2-ene,
5-methyl-5-ethoxycarbonyl bicyclo[2.2.1]hept-2-ene,
5-methyl-5-n-propoxycarbonylbicyclo[2.2.1]hept-2-ene,
5-methyl-5-i-propoxycarbonylbicyclo[2.2.1]hept-2-ene,
5-methyl-5-n-butoxycarbonylbicyclo[2.2.1]hept-2-ene,
5-methyl-5-(2'-methylpropoxy)carbonylbicyclo[2.2.1]hept-2-ene,
5-methyl-5-(1'-methylpropoxy)carbonylbicyclo[2.2.1]hept-2-ene,
5-methyl-5-t-butoxycarbonylbicyclo[2.2.1]hept-2-ene,
5-methyl-5-cyclohexyloxycarbonylbicyclo[2.2.1]hept-2-ene,
5-methyl-5-(4'-t-butylcyclohexyloxy)carbonylbicyclo[2.2.1]hept-2-ene,
5-methyl-5-phenoxycarbonylbicyclo[2.2.1]hept-2-ene,
5-methyl-5-(1l-ethoxyethoxy)carbonylbicyclo[2.2.1]hept-2-ene,
5-methyl-5-(1'-cyclohexyloxyethoxy)carbonylbicyclo[2.2.1]hept-2-ene,
5-methyl-5-t-butoxycarbonylmethoxycarbonylbicyclo[2.2.1]hept-2-ene,
5-methyl-5-tetrahydrofuranyloxycarbonylbicyclo[2.2.1]hept-2-ene,
5-methyl-5-tetrahydropyranyloxycarbonylbicyclo[2.2.1]hept-2-ene,
5,6-di(methoxycarbonyl)bicyclo[2.2.1]hept-2-ene,
5,6-di(ethoxycarbonyl)bicyclo[2.2.1]hept-2-ene,
5,6-di(n-propoxycarbonyl)bicyclo[2.2.1]hept-2-ene,
5,6-di(i-propoxycarbonyl)bicyclo[2.2.1]hept-2-ene,
5,6-di(n-butoxycarbonyl)bicyclo[2.2.1]hept-2-ene,
5,6-di(2'-methylpropoxycarbonyl)bicyclo[2.2.1]hept-2-ene,
5,6-di(1'-methylpropoxycarbonyl)bicyclo[2.2.1]hept-2-ene,
5,6-di(t-butoxycarbonyl)bicyclo[2.2.1]hept-2-ene,
5,6-di(cyclohexyloxycarbonyl)bicyclo[2.2.1]hept-2-ene,
5,6-di(4'-t-butylcyclohexyloxycarbonyl)bicyclo[2.2.1]hept-2-ene,
5,6-di(phenoxycarbonyl)bicyclo[2.2.1]hept-2-ene,
5,6-di(1'-ethoxyethoxycarbonyl)bicyclo[2.2.1]hept-2-ene,
5,6-di(1'-cyclohexyloxyethoxycarbonyl)bicyclo[2.2.1]hept-2-ene,
5,6-di(t-butoxycarbonylmethoxycarbonyl)bicyclo[2.2.1]hept-2-ene,
5,6-di(tetrahydrofuranyloxycarbonyl)bicyclo[2.2.1]hept-2-ene, and
5,6-di(tetrahydropyranyloxycarbonyl)bicyclo[2.2.1]hept-2-ene.

The following compounds are given as specific examples of norbornene derivative (α) with n=1 in the formula (6):
8-methoxycarbonyltetracyclo[4.4.0.1$^{2,5}$.1$^{7,10}$]dodec-3-ene,
8-ethoxycarbonyltetracyclo[4.4.0.1$^{2,5}$.1$^{7,10}$]dodec-3-ene,
8-n-propoxycarbonyltetracyclo[4.4.0.1$^{2,5}$.1$^{7,10}$]dodec-3-ene,
8-i-propoxycarbonyltetracyclo[4.4.0.1$^{2,5}$.1$^{7,10}$]dodec-3-ene,
8-n-butoxycarbonyltetracyclo[4.4.0.1$^{2,5}$.1$^{7,10}$]dodec-3-ene,
8-(2'-methylpropoxy)carbonyltetracyclo[4.4.0.1$^{2,5}$.1$^{7,10}$]dodec-3-ene,
8-(1'-methylpropoxy)carbonyltetracyclo[4.4.0.1$^{2,5}$.1$^{7,10}$]dodec-3-ene,
8-t-butoxycarbonyltetracyclo[4.4.0.1$^{2,5}$.1$^{7,10}$]dodec-3-ene,
8-cyclohexyloxycarbonyltetracyclo[4.4.0.1$^{2,5}$.1$^{7,10}$]dodec-3-ene,
8-(4'-t-butylcyclohexyloxy)carbonyltetracyclo[4.4.0.1$^{2,5}$.1$^{7,10}$]dodec-3-ene,
8-phenoxycarbonyltetracyclo[4.4.0.1$^{2,5}$.1$^{7,10}$]dodec-3-ene,
8-(1'-ethoxyethoxy)carbonyltetracyclo[4.4.0.1$^{2,5}$.1$^{7,10}$]dodec-3-ene,
8-(1'-cyclohexyloxyethoxy)carbonyltetracyclo[4.4.0.1$^{2,5}$.1$^{7,10}$]dodec-3-ene,
8-t-butoxycarbonylmethoxycarbonyltetracyclo[4.4.0.1$^{2,5}$.1$^{7,10}$]dodec-3-ene,
8-tetrahydrofuranyloxycarbonyltetracyclo[4.4.0.1$^{2,5}$.1$^{7,10}$]dodec-3-ene,
8-tetrahydropyranyloxycarbonyltetracyclo[4.4.0.1$^{2,5}$.1$^{7,10}$]dodec-3-ene,
8-methyl-8-methoxycarbonyltetracyclo[4.4.0.1$^{2,5}$.1$^{7,10}$]dodec-3-ene,
8-methyl-8-ethoxycarbonyltetracyclo[4.4.0.1$^{2,5}$.1$^{7,10}$]dodec-3-ene,
8-methyl-8-n-propoxycarbonyltetracyclo[4.4.0.1$^{2,5}$.1$^{7,10}$]dodec-3-ene,
8-methyl-8-i-propoxycarbonyltetracyclo[4.4.0.1$^{2,5}$.1$^{7,10}$]dodec-3-ene,
8-methyl-8-n-butoxycarbonyltetracyclo[4.4.0.1$^{2,5}$.1$^{7,10}$]dodec-3-ene,
8-methyl-8-(2'-methylpropoxy)carbonyltetracyclo[4.4.0.1$^{2,5}$.1$^{7,10}$]dodec-3-ene,
8-methyl-8-(1'-methylpropoxy)carbonyltetracyclo[4.4.0.1$^{2,5}$.1$^{7,10}$]dodec-3-ene,
8-methyl-8-t-butoxycarbonyltetracyclo[4.4.0.1$^{2,5}$.1$^{7,10}$]dodec-3-ene,
8-methyl-8-cyclohexyloxycarbonyltetracyclo[4.4.0.1$^{2,5}$.1$^{7,10}$]dodec-3-ene,
8-methyl-8-(4'-t-butyl cyclohexyl oxy) carbonyltetracyclo[4.4.0.1$^{2,5}$.1$^{7,10}$]dodec-3-ene,
8-methyl-8-phenoxycarbonyltetracyclo[4.4.0.1$^{2,5}$.1$^{7,10}$]dodec-3-ene,
8-methyl-8-(1'-ethoxyethoxy)carbonyltetracyclo[4.4.0.1$^{2,5}$.1$^{7,10}$]dodec-3-ene,
8-methyl-8-(1'-cyclohexyloxyethoxy)carbonyltetracyclo[4.4.0.1$^{2,5}$.1$^{7,10}$]dodec-3-ene,
8-methyl-8-t-butoxycarbonylmethoxycarbonyltetracyclo[4.4.0.1$^{2,5}$.1$^{7,10}$]dodec-3-ene,
8-methyl-8-tetrahydrofuranyloxycarbonyltetracyclo[4.4.0.1$^{2,5}$.1$^{7,10}$]dodec-3-ene,
8-methyl-8-tetrahydropyranyloxycarbonyltetracyclo[4.4.0.1$^{2,5}$.1$^{7,10}$]dodec-3-ene,
8,9-di(methoxycarbonyl)tetracyclo[4.4.0.1$^{2,5}$.1$^{7,10}$]dodec-3-ene,
8,9-di(ethoxycarbonyl)tetracyclo[4.4.0.1$^{2,5}$.1$^{7,10}$]dodec-3-ene,
8,9-di(n-propoxycarbonyl)tetracyclo[4.4.0.1$^{2,5}$.1$^{7,10}$]dodec-3-ene,
8,9-di(i-propoxycarbonyl)tetracyclo[4.4.0.1$^{2,5}$.1$^{7,10}$]dodec-3-ene,
8,9-di(n-butoxycarbonyl)tetracyclo[4.4.0.1$^{2,5}$.1$^{7,10}$]dodec-3-ene,
8,9-di(2'-methylpropoxycarbonyl)tetracyclo[4.4.0.1$^{2,5}$.1$^{7,10}$]dodec-3-ene,
8,9-di(1'-methylpropoxycarbonyl)tetracyclo[4.4.0.1$^{2,5}$.1$^{7,10}$]dodec-3-ene,
8,9-di(t-butoxycarbonyl)tetracyclo[4.4.0.1$^{2,5}$.1$^{7,10}$]dodec-3-ene,
8,9-di(cyclohexyloxycarbonyl)tetracyclo[4.4.0.1$^{2,5}$.1$^{7,10}$]dodec-3-ene, 8,9-di(4'-t-butylcyclohexyloxycarbonyl)tetracyclo[4.4.0.1$^{2,5}$.1$^{7,10}$]dodec-3-ene, 8,9-di(phenoxycarbonyl)tetracyclo[4.4.0.1$^{2,5}$.1$^{7,10}$]dodec-3-ene, 8,9-di(1'-ethoxyethoxycarbonyl)tetracyclo[4.4.0.1$^{2,5}$.1$^{7,10}$]dodec-3-ene, 8,9-di(1'-cyclohexyloxyethoxycarbonyl)tetracyclo[4.4.0.1$^{2,5}$.1$^{7,10}$]dodec-3-ene, 8,9-di(t-butoxycarbonylmethoxycarbonyl)tetracyclo[4.4.0.1$^{2,5}$.1$^{7,10}$]dodec-3-ene, 8,9-di(tetrahydrofuranyloxycarbonyl)tetracyclo[4.4.0.1$^{2,5}$.1$^{7,10}$]dodec-3-ene, and 8,9-di(tetrahydropyranyloxycarbonyl)tetracyclo[4.4.0.1$^{2,5}$.1$^{7,10}$]dodec-3-ene.

The recurring units (I) may be present either individually or in combinations of two or more in the copolymer (A).

In addition to the above-described recurring unit (I), the copolymer (A) may contain the recurring unit (II) of the above formula (2). The recurring unit (II) in the copolymer (A) not only increases affinity of the resin composition to a developer, but also improves adhesion to substrates. In addition, incorporation of the recurring unit (II) accelerates the polymerization reaction for producing the copolymer (A) and increases the polymerization capability of the recurring unit (I).

The recurring unit (III) has a function of reducing movement of the polymer molecule chains by introducing moderate branched structures in the copolymer (A), thereby suppressing the heat distortion and improving the heat resistance of the copolymer (A). Another function of the recurring unit (III) is to decrease the molecular weight of the copolymer (A) through decomposition with an acid. In addition, introduction of branched structures in the copolymer (A) by the recurring unit (III) lowers the viscosity of the polymer solution as compared with polymers with a straight chain structure. This increases the molecular weight of the copolymer (A), resulting in further improvement in the heat resistance and resolution as a resist. Moreover, inclusion of a specific group which decomposes in the presence of an acid (acid-decomposable group) in the recurring unit (III) causes the branched structure in the copolymer (A) to destroy, thereby decreasing the molecular weight of the copolymer. Thus, the solubility of copolymer (A) in the presence of an acid increases, which remarkably improves resolution as a resist.

The monomer which gives such a recurring unit (III) contains at least one divalent group which is selected from the divalent ester groups of the above-mentioned formula (3) (hereinafter called "ester group (3)") and the divalent carbonate groups of the above-mentioned formula (4) (hereinafter called "carbonate group (4)"). Such a monomer is hereinafter called "monomer (β)".

Among these monomers (β), the monomers having the ester group (3) can be synthesized, for example, by an esterification reaction of a polyol having at least one tertiary hydroxyl group and a monovalent carboxylic acid having a polymerizable carbon—carbon double bond.

This esterification reaction can be carried out, for instance, by an acid chloride method comprising reacting the acyl chloride of the monovalent carboxylic acid with the polyol, a method of reacting the polyol and the monovalent carboxylic acid using a coupling agent such as dicyclohexyl carbodiimide, a method of reacting the polyol and the monovalent carboxylic acid in the presence of a strong acid anhydride such as trifluoroacetic acid anhydride as a dehydrating agent, and an ester exchange reaction between the polyol and the ester of the monovalent carboxylic acid.

The compounds of the following formulas (7) to (9) can be given as the polyol having a tertiary hydroxyl group used for synthesizing the monomer (β) which has an ester group (3).

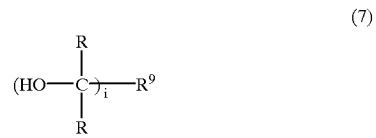
(7)

wherein R, which exists two or more maybe identical or different from each other, has the same meaning as the R$^1$, R$^2$, R$^3$, or R$^4$ previously defined in the formula (3) or (4), R$^9$ indicates an organic group with a valence of i, provided that R$^9$ is a single bond when i=2, and i is an integer of 2 to 4.

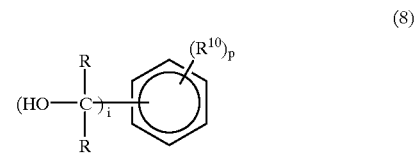
(8)

wherein R, which exists two or more may be identical or different from each other, has the same meaning as the R$^1$, R$^2$, R$^3$, or R$^4$ previously defined in the formula (3) or (4), R$^{10}$ indicates an alkyl group having 1–5 carbon atoms, with two or more R$^{10}$, if present, being either identical or different from each other, j is an integer from 2 to 4, and p is an integer from 0 to 4, provided that j+p≦6.

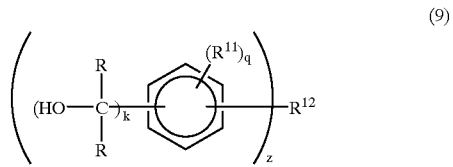
(9)

wherein R, which exists two or more may be identical or different from each other, has the same meaning as the R$^1$, R$^2$, R$^3$, or R$^4$ previously defined in the formula (3) or (4), R$^{11}$ indicates an alkyl group having 1–5 carbon atoms, with two or more R$^{11}$, if present, being either identical or different from each other, R$^{12}$ indicates an organic group with a valence of z, —O—, —S—, —CO—, or —SO$_2$—, k is an integer of 1 or 2, q is an integer of 0–3, and z is an integer of 2–4.

The following compounds are given as examples of the compounds of the formula (7): divalent tertiary alcohols such as 2,3-dimethyl-2,3-butanediol, 2,3-diethyl-2,3-butanediol, 2,3-di-n-propyl-2,3-butanediol, 2,3-diphenyl-2,3-butanediol,. 2,4-dimethyl-2,4-pentanediol, 2,4-diethyl-2,4-pentanediol, 2,4-di-n-propyl-2,4-pentanediol, 2,4-diphenyl-2,4-pentanediol, 2,5-dimethyl-2,5-hexanediol, 2,5-diethyl-2,5-hexanediol, 2,5-di-n-propyl-2,5-hexanediol, 2,5-diphenyl-2,5-hexanediol, 2,6-dimethyl-2,6-heptanediol, 2,6-diethyl-2,6-heptanediol, 2,6-di-n-propyl-2,6-heptanediol, and diphenyl-2,6-heptanediol; tri-valent tertiary alcohols such as 2,4-dimethyl-2,4-dihydroxy-3-(2-hydroxypropyl)pentane, 2,4-diethyl-2,4-dihydroxy-3-(2-hydroxypropyl)pentane, 2,5-dimethyl-2,5-dihydroxy-3-(2-hydroxypropyl)hexane, and 2,5-diethyl-2,5-dihydroxy-3-(2-hydroxypropyl)hexane; and tetra-valent tertiary alcohols such as 2,4-dimethyl-2,4-dihydroxy-3,3-di(2- hydroxypropyl)pentane, 2,4-diethyl-2,4-dihydroxy-3,3-di (2-hydroxypropyl)pentane, 2,5-dimethyl-2,5-dihydroxy-3, 4-di(2-hydroxypropyl)hexane, and 2,5-diethyl-2,4-dihydroxy-3,4-di(2-hydroxypropyl)hexane.

As examples of the compound of the formula (8), 1,4-di (2-hydroxypropyl)benzene, 1,3-di(2-hydroxypropyl) benzene, 1,3,5-tri(2-hydroxypropyl)benzene, and 1,2,4,5-tetra(2-hydroxypropyl)benzene can be given.

As examples of the compound shown by the formula (9), 2,2-bis{4-(2-hydroxypropyl)phenyl}propane, 1,2,2-tris{4-(2-hydroxypropyl)phenyl}propane, 1,2,3,4-tetra{4-(2-hydroxypropyl)phenyl}butane, bis{4-(2-hydroxypropyl) phenyl}ether, bis{4-(2-hydroxypropyl)phenyl}sulfide, bis{4-(2-hydroxypropyl)phenyl}ketone, and bis{4-(2-hydroxypropyl)phenyl}sulfone can be given.

Of these di- to tetra-valent tertiary alcohols of the formula (7) to (9), 2,5-dimethyl-2,5-hexanediol, 1,4-di(2-hydroxypropyl)benzene, 1,3-di(2-hydroxypropyl)benzene, and the like are particularly preferred.

As examples of monovalent carboxylic acid having a polymerizable carbon—carbon double bond which is used for synthesizing the monomer (β) having the ester group (3), unsaturated monocarboxylic acids such as (meth) acrylic acid and crotonic acid can be given.

The monomer (β) which has the carbonate group (4) can be prepared by reacting a polyol having at least one tertiary hydroxyl group with phosgene, for instance, to obtain a poly (chloroformate) compound, then reacting this compound with a monohydric alcohol having one polymerizable carbon—carbon double bond.

As the polyol having at least one tertiary hydroxyl group used for preparing the monomer (β) having the carbonate group (4), the same di- to tetra-valence tertiary alcohols that have been given as the polyols for synthesizing the above-mentioned monomer (β) having the ester group (3) can be used.

Of these di- to tetra-valence tertiary alcohols, 2,5-dimethyl-2,5-hexanediol, 1,4-di(2-hydroxypropyl)benzene, 1, 3-di(2-hydroxypropyl)benzene, and the like are particularly preferred.

Given as examples of monohydric alcohol having one polymerizable carbon—carbon double bond used for preparing the monomer (β) having carbonate group (4) are hydroxy styrenes such as o-hydroxy styrene, m-hydroxy styrene, p-hydroxy styrene, o-isopropenylphenol, m-isopropenylphenol, and p-isopropenylphenol; hydroxy-alkyl (meth)acrylates such as 2-hydroxyethyl (meth) acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth) acrylate; and the like.

These recurring units (III) may be present either singly or in combinations of two or more in the copolymer (A).

In addition to the above-described recurring units (I) (II), and (III), the copolymer (A) may include one or more recurring units originating from other polymerizable unsaturated compounds. Such recurring units may be a recurring unit obtained by cleavage of a polymerizable carbon—carbon double bond in norbornene(bicyclo[2.2.1]hept-2-ene) or a norbornene derivative which does not have an acid-decomposable group (hereinafter called "norbornene derivative (γ)") or a recurring unit obtained by cleavage of a polymerizable carbon—carbon double bond possessed by other compounds having a polymerizable carbon—carbon double bond (hereinafter called "monomer (δ)"). These recurring units other than recurring units (I), (II), or (III) are hereinafter called "other recurring units").

The following compounds are given as examples of the norbornene derivative (γ):
5-methylbicyclo[2.2.1]hept-2-ene,
5-ethylbicyclo[2.2.1]hept-2-ene,
5-hydroxybicyclo[2.2.1]hept-2-ene,
5-hydroxymethylbicyclo[2.2.1]hept-2-ene, tetracyclo [4.4.0.1$^{2,5}$.1$^{7,10}$]dodec-3-ene,
8-methyltetracyclo[4.4.0.1$^{2,5}$.1$^{7,10}$]dodec-3-ene,
8-ethyltetracyclo[4.4.0.1$^{2,5}$.1$^{7,10}$]dodec-3-ene,
8-hydroxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-fluorotetracyclo[4.4.0.1$^{2,5}$.1$^{7,10}$]dodec-3-ene,
8-fluoromethyltetracyclo[4.4.0.1$^{2,5}$.1$^{7,10}$]dodec-3-ene,
8-difluoromethyltetra cyclo[4.4.0.1$^{2,5}$.1$^{7,10}$]dodec-3-ene,
8-trifluoromethyltetracyclo[4.4.0.1$^{2,5}$.1$^{7,10}$]dodec-3-ene,
8-pentafluoroethyltetracyclo[4.4.0.1$^{2,5}$.1$^{7,10}$]dodec-3-ene,
8,8-difluorotetracyclo[4.4.0.1$^{2,5}$.1$^{7,10}$]dodec-3-ene,
8,9-difluorotetracyclo[4.4.0.1$^{2,5}$.1$^{7,10}$]dodec-3-ene,
8,8-bis(trifluoromethyl)tetracyclo[4.4.0.1$^{2,5}$.1$^{7,10}$]dodec-3-ene,
8-methyl-8-hydroxyomethyltetracyclo [4.4.0.1$^{2,5}$.1$^{7,10}$] dodec-3-ene,
8,9-bis(trifluoromethyl)tetracyclo[4.4.0.1$^{2,5}$.1$^{7,10}$]dodec-3-ene,
8-methyl-8-trifluoromethyltetracyclo[4.4.0.1$^{2,5}$.1$^{7,10}$] dodec-3-ene,
8,8,9-trifluorotetracyclo[4.4.0.1$^{2,5}$.1$^{7,10}$]dodec-3-ene,
8,8,9-tris(trifluoromethyl)tetracyclo[4.4.0.1$^{2,5}$.1$^{7,10}$]dodec-3-ene,
8,8,9,9-tetrafluorotetracyclo[4.4.0.1$^{2,5}$.1$^{7,10}$]dodec-3-ene,
8,8,9,9-tetrakis(trifluoromethyl)tetracyclo[4.4.0.1$^{2,5}$.1$^{7,10}$] dodec-3-ene,
8,8-difluoro-9,9-bis(trifluoromethyl)tetracyclo[4.4.0.1$^{2,5}$.1$^{7,10}$]dodec-3-ene,
8,9-difluoro-8,9-bis(trifluoromethyl)tetracyclo[4.4.0.1$^{2,5}$.1$^{7,10}$]dodec-3-ene,
8,8,9-trifluoro-9-trifluoromethyltetracyclo[4.4.0.1$^{2,5}$.1$^{7,10}$] dodec-3-ene,
8,8,9-trifluoro-9-trifluoromethoxytetracyclo[4.4.0.1$^{2,5}$.1$^{7,10}$]dodec-3-ene,
8,8,9-trifluoro-9-pentafluoropropoxytetracyclo[4.4.0.1$^{2,5}$.1$^{7,10}$]dodec-3-ene,
8-fluoro-8-pentafluoroethyl-9,9-bis(trifluoromethyl) tetracyclo[4.4.0.1$^{2,5}$.1$^{7,10}$]dodec-3-ene,
8,9-difluoro-8-heptafluoroisopropyl-9-trifluoromethyltetracyclo[4.4.0.1$^{2,5}$.1$^{7,10}$]dodec-3-ene,
8-chloro-8,9,9-trifluorotetracyclo[4.4.0.1$^{2,5}$.1$^{7,10}$]dodec-3-ene,
8,9-dichloro-8,9-bis(trifluoromethyl)tetracyclo[4.4.0.1$^{2,5}$.1$^{7,10}$]dodec-3-ene,
8-(2',2',2'-trifluorocarboxyethyl)tetracyclo[4.4.0.1$^{2,5}$.1$^{7,10}$] dodec-3-ene,
8-methyl-8-(2',2',2'-trifluorocarboxyethyl)tetracyclo [4.4.0.1$^{2,5}$.1$^{7,10}$]dodec-3-ene, dicyclopentadiene,
tricyclo[5.2.1.0$^{2,6}$]dec-8-ene, tricyclo[5.2.1.0$^{2,6}$]dec-3-ene,
tricyclo[4.4.0.1$^{2,5}$]undec-3-ene, tricyclo[6.2.1.0$^{1,8}$]undec-9-ene, tricyclo[6.2.1.0$^{1,8}$]undec-4-ene,
tetracyclo[4.4.0.1$^{2,5}$.1$^{7,10}$.0$^{1,6}$]dodec-3-ene,
8-methyltetracyclo[4.4.0.1$^{2,5}$.1$^{7,10}$.0$^{1,6}$]dodec-3-ene,
8-ethylidenetetracyclo[4.4.0.1$^{2,5}$.1$^{7,12}$]dodec-3-ene,
8-ethylidenetetracyclo[4.4.0.1$^{2,5}$.1$^{7,10}$.0$^{1,6}$]dodec-3-ene,
pentacyclo[6.5.1.1$^{3,6}$.0$^{2,7}$.0$^{9,13}$]pentadec-4-ene, and
pentacyclo[7.4.0.1$^{2,5}$.1$^{9,12}$.0$^{8,13}$]pentadec-3-ene.

The following norbornene derivatives can also be used:
5-oxobicyclo[2.2.1]hept-2-ene,
5-hydroxymethyloxycarbonylbicyclo[2.2.1]hept-2-ene,
5-(2-hydroxyethyl)oxycarbonylbicyclo[2.2.1]hept-2-ene, 5-(2-hydroxypropyl)oxycarbonylbicyclo[2.2.1]hept-2-ene,
5-(2-hydroxybutyl)oxycarbonylbicyclo[2.2.1]hept-2-ene,
8-oxotetracyclo[4.4.0.1$^{2,5}$.1$^{7,10}$]dodec-3-ene,
8-hydroxymethyloxycarbonyltetracyclo[4.4.0.1$^{2,5}$.1$^{7,10}$] dodec-3-ene,
8-(2-hydroxyethyl)oxycarbonyltetracyclo[4.4.0.1$^{2,5}$.1$^{7,10}$] dodec-3-ene,
8-(2-hydroxypropyl)oxycarbonyltetracyclo[4.4.0.1$^{2,5}$.1$^{7,10}$] dodec-3-ene,
8-(2-hydroxybutyl)oxycarbonyltetracyclo[4.4.0.1$^{2,5}$.1$^{7,10}$] dodec-3-ene,
8-methyl-8-hydroxymethyloxycarbonyltetracyclo[4.4.0.1$^{2,5}$.1$^{7,10}$]dodec-3-ene,
8-methyl-8-(2-hydroxyethyl)oxycarbonyltetracyclo [4.4.0.1$^{2,5}$.1$^{7,10}$]dodec-3-ene,
8-methyl-8-(2-hydroxypropyl)oxycarbonyltetracyclo [4.4.0.1$^{2,5}$.1$^{7,10}$]dodec-3-ene,
8-methyl-8-(2-hydroxybutyl)oxycarbonyltetracyclo [4.4.0.1$^{2,5}$.1$^{7,10}$]dodec-3-ene,
bicyclo[2.2.1]hept-2-ene-5- (γ-butyrolactone-2-yl) carboxylate,
bicyclo [2.2.1]hept-2-ene-5-methyl-5- (γ-butyrolactone-2-yl)carboxylate,
tetracyclo[4.4.0.1$^{2,5}$.1$^{7,10}$]dodec-3-ene-8- (γ-butyrolactone-2-yl)carboxylate, and
tetracyclo[4.4.0.1$^{2,5}$.1$^{7}$]dodec-3-ene-8-methyl-8-(γ-butyrolactone-2-yl)carboxylate.

The following compounds are given as examples of monomer (δ): (meth)acrylic acid esters such as (meth) acrylate, norbornyl (meth)acrylate, isobornyl (meth) acrylate, tricyclodecanyl (meth)acrylate, tetracyclododecanyl (meth)acrylate, dicyclopentenyl (meth)acrylate, adamantyl (meth)acrylate, adamantylmethyl (meth)acrylate, 1-methyladamantyl (meth)acrylate, methyl (meth)acrylate, ethyl (meth)acrylate, n-propyl (meth)acrylate, n-butyl (meth)acrylate, 2-hydroxyethyl (meth)acrylate, 2-hydroxypropyl (meth)acrylate, 3-hydroxypropyl (meth) acrylate, cyclopropyl (meth)acrylate, cyclopentyl (meth) acrylate, cyclohexyl (meth)acrylate, cyclohexenyl (meth) acrylate, 4-methoxycyclohexyl (meth)acrylate , 2-cyclopropyl oxycarb onylethyl (meth) acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, 2-(4-methoxycyclohexyl)oxycarbonylethyl (meth)acrylate , and 2-acetoxyethyl (meth) acrylate; α-hydroxymethyl acrylates such as methyl α-hydroxymethyl acrylate, ethyl α-hydroxymethyl acrylate, n-propyl α-hydroxymethyl acrylate, and n-butyl α-hydroxymethyl acrylate; vinyl esters such as vinyl acetate, vinyl propionate, and vinyl butyrate; unsaturated nitrile compounds such as acrylonitrile, α-chloroacrylonitrile, crotononitrile, malononitrile, fumaronitrile, mesacononitrile, citracononitrile, and itacononitrile; unsaturated amide compounds such as (meth) acrylamide, N,N-dimethyl (meth)acrylamide, crotonamide, maloamide, fumaramide, mesaconamide, citraconamide, and itaconamide; other nitrogen-containing vinyl compounds such as N-vinyl-ε-caprolactam, N-vinyl pyrrolidone, vinylpyridine, and vinyl imidazole; unsaturated carboxylic acids such as (meth) acrylic acid, crotonic acid, maleic acid, fumaric acid, itaconic acid, citraconic acid, and mesaconic acid; carboxyl group-containing esters of unsaturated carboxylic acid such as 2-carboxyethyl (meth)acrylate, 2-carboxypropyl (meth)acrylate, 3-carboxypropyl (meth) acrylate, 4-carboxybutyl (meth)acrylate, 4-carboxycyclohexyl (meth)acrylate, carboxytricyclodecanyl (meth) acrylate, and carboxytetracyclodecanyl (meth) acrylate; and compounds derived from said unsaturated carboxylic acids or carboxyl group-containing esters of unsaturated carboxylic acid by replacing a hydrogen atom in the carboxyl group with an acid-decomposable organic group (hereinafter called "acid-decomposable organic group (ii)") exemplified below.

As examples of acid-decomposable group (ii), substituted methyl groups, 1-substituted ethyl groups, 1-branched alkyl groups, silyl groups, germyl groups, alkoxycarbonyl groups, acyl groups, and cyclic acid-decomposable groups (excluding alicyclic groups) can be given.

Specific examples of substituted methyl groups include methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, iso-propoxycarbonylmethyl group, n-butoxycarbonylmethyl group, and t-butoxycarbonylmethyl group.

Given as examples of 1-substituted ethyl groups are 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n- propoxycarbonylethyl group, 1-iso-propoxycarbonylethyl group, 1-n-butoxycarbonylethyl group, and 1-t-butoxycarbonylethyl group.

As examples of 1-branched alkyl groups, isopropyl group, sec-butyl group, t-butyl group, 1,1-dimethylpropyl group, 1-methylbutyl group, and 1,1-dimethylbutyl group can be given.

Given as examples of silyl groups are trimethylsilyl group, ethyldimethylsilyl group, methyldiethylsilyl group, triethylsilyl group, isopropyldimethylsilyl group, methyldiisopropylsilyl group, tri-isopropylsilyl group, t-butyldimethylsilyl group, methyl-di-t-butylsilyl group, tri-t-butylsilyl group, phenyldimethylsilyl group, methyldiphenylsilyl group, and triphenylsilyl group.

Given as examples of germyl group are trimethylgermyl group, ethyldimethylgermyl group, methyldiethylgermyl group, triethylgermyl group, isopropyldimethylgermyl group, methyl diisopropylgermyl group, triisopropylgermyl group, t-butyldimethylgermyl group, methyl-di-t-butylgermyl group, tri-t-butylgermyl group, phenyldimethylgermyl group, methyldiphenylgermyl group, and triphenylgermyl group.

As examples of alkoxy carbonyl groups, methoxycarbonyl group, ethoxycarbonyl group, iso-propoxycarbonyl group, t-butoxycarbonyl group, and the like can be given.

Given as examples of acyl groups are acetyl group, propionyl group, butyryl group, heptanoyl group, hexanoyl group, valeryl group, pivaloyl group, iso-valeryl group, lauryloyl group, myristoyl group, palmitoyl group, stearoyl group, oxalyl group, malonyl group, scucinyl group, glutaryl group, adipoyl group, piperoylgroup, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoil group, phthaloyl group, iso-phthaloyl group, terephthaloyl group, naphthoyl group, toluoyl group, hydroatropoyl group, atropoyl group, cinnamoyl group, furoyl group, thenoyl group, nicotinoyl group, iso-nicotinoyl group, p-toluenesulfonyl group, mesyl group, and the like.

As examples of cyclic acid-decomposable groups, 3-oxocyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 2-oxo-4-methyl-4-tetrahydropyranyl group, 4-methoxytetrahydrothiopyranyl group, 3-tetrahydrothiophene-1,1-dioxide group, and the like can be given.

The contents of the above-described recurring units in the copolymer (A) are as follows.

When the copolymer (A) contains the recurring unit (I), recurring unit (III), and the other recurring units, the content of the recurring unit (I) is usually from 30 to 99 mol %, preferably from 35 to 98 mol %, and more preferably from 40 to 97 mol %; the content of the recurring unit (III) is usually from 1 to 70 mol %, preferably from 2 to 65 mol %, and particularly preferably from 3 to 60 mol %; and the content of the other recurring units is 50 mol % or less, preferably 40 mol % or less, and more preferably 30 mol % or less. If the content of the recurring unit (I) is less than 30 mol %, the dry etching resistance tends to become poor. If the content of the recurring unit (III) is less than 1 mol %, the composition tends to exhibit poor sensitivity and resolution as a resist; if more than 70 mol %, on the other hand, the sensitivity as a resist may become poor. If the content of the other recurring unit exceeds 50 mol %, the dry etching resistance, sensitivity as a resist, and adhesion with substrate tend to be impaired.

When the copolymer (A) comprises the recurring unit (I), recurring unit (II), recurring unit (III), and the other recurring unit, the content of the recurring unit (I) is usually from 30 to 60 mol %, preferably from 35 to 55 mol %, and more preferably from 40 to 50 mol %; the content of the recurring unit (II) is usually from 30 to 69 mol %, preferably from 35 to 64 mol %, and more preferably from 40 to 59 mol %; the content of the recurring unit (III) is usually from 1 to 40mol %, preferably from 2 to 30 mol %, and more preferably from 3 to 20 mol %; and the content of the other recurring unit is usually 30 mol % or less, preferably 20 mol % or less, and more preferably 10 mol % or less. If the content of the recurring unit (I) is less than 30 mol %, the dry etching resistance tends to decrease. If the content of the recurring unit (II) is less than 30 mol %, the composition tends to exhibit poor resolution as a resist; if more than 69 mol %, on the other hand, the dry etching resistance tends to become poor. If the content of the recurring unit (III) is less than 1 mol %, the composition tends to exhibit poor sensitivity and resolution as a resist; if more than 40 mol %, on the other hand, the sensitivity as a resist may become poor. If the content of the other recurring unit exceeds 30 mol %, the dry etching resistance, sensitivity as a resist, and adhesion with substrate tend to be impaired.

The copolymer (A) can be prepared, for example, by the following methods (a) to (c).

(a) A method of radically copolymerizing at least one monomer ($\alpha$) and at least one monomer ($\beta$) or at least one monomer ($\alpha$), maleic anhydride, and at least one monomer ($\beta$), optionally, together with at least one other polymerizable unsaturated compound.

(b) A method of partially hydrolyzing and/or solvolyzing the copolymer obtained in the method (a).

(c) A method of at least partially esterifying the carboxyl group in the copolymer obtained by the method (a) or (b) to convert the carboxyl group into the group —COOR' and/or the group —COOCH$_2$COOR".

In the above-mentioned method (a), the copolymer (A) is prepared in a suitable solvent in the presence of a radical polymerization initiator such as a hydroperoxide compound, dialkyl peroxide compound, diacyl peroxide compound, or azo compound.

Given as examples of the solvent used in the polymerization are alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutane, bromohexane, dichloroethane, hexamethylene dibromide, and chlorobenzene; saturated carboxylic acid esters such as ethyl acetate, n-butyl acetate, i-butyl acetate, and methyl propionate; and ethers such as tetrahydrofuran, dimethoxyethane, and diethoxyethane.

These solvents can be used either individually or in combinations of two or more.

The polystyrene-standardized weight average molecular weight (hereinafter referred to as "Mw") of the copolymer (A) determined by gel permeation chromatography (GPC) is usually from 5,000 to 300,000, preferably from 5,000 to 200,000, and more preferably from 10,000 to 100,000. If Mw is less than 5,000, the heat resistance of the copolymer (A) as a resist tends to be impaired; if more than 300,000, on the other hand, developability of a resist tends to be impaired.

When the copolymer (A) contains the crosslinking structure of the recurring unit (III) in the molecule, the ratio (Mw/Mn), which is the ratio of polystyrene-standardized weight average molecular weight (Mw) to polystyrene-standardized number average molecular weight (Mn) determined by GPC, of the copolymer (A) tends to increase. The greater the introduction ratio of said crosslinking structure, the higher the ratio (Mw/Mn.) The ratio Mw/Mn of the copolymer (A) is preferably from 1.5 to 100, more preferably from 5 to 50, and particularly preferably from 10 to 30. If the ratio Mw/Mn is less than 1.5, it may be difficult to obtain a sufficient contrast; if more than 100, the development performance of the resist tends to decrease.

Moreover, the ratio of the area occupied by the components with Mw of less than 2,000 (hereinafter called "low molecular weight components") in the gel permeation chromatogram of the copolymer (A) is preferably 30% or less, more preferably 20% or less, and even more preferably 10% or less, in the total area. If the ratio of the area occupied by the low molecular weight components exceeds 30%, it may be difficult to obtain a sufficient contrast. The amount of the low molecular weight components in the copolymer (A) can be reduced by treating the copolymer obtained by the above-mentioned method (a) by means of, for example, re-precipitation with a poor solvent, liquid-liquid extraction using a good solvent and a poor solvent, or super critical extraction.

In addition, the amount of residual monomers in the copolymer (A), in terms of the area ratio in gel permeation chromatogram, should preferably be 2% or less, more preferably 1% or less, and particularly preferably 0.5% or less. If the amount of the residual monomers exceeds 2%, storage stability of the composition tends to decrease.

In the first invention, the copolymer (A) can be used either individually or in combinations of two or more.

Component (B)

The component (B) in the first invention is a photoacid generator which generates an acid by exposure to radiation (hereinafter called "exposure").

The acid generator (B) causes the acid-decomposable organic groups which are present in the copolymer (A) or in the alicyclic compound (C) described later as a preferable embodiment to dissociate by the action of the acid which is generated by exposure. As a result, exposed area in the resist film becomes easily soluble in an alkaline developer, whereby a positive tone resist pattern can be formed.

As examples of such an acid generator (B), onium salts, halogen-containing compounds, diazoketone compounds, sulfone compounds, sulfonic acid compounds, and the like can be given.

The following compounds can be given as examples of specific compounds used as the acid generator (B).

Onium salt:

Iodonium salts, sulfonium salts (including tetrahydrothiophenium salts), phosphonium salts, diazonium salts, pyridinium salts, and the like can be given as onium salts.

The following compounds can be given as specific examples of preferable onium salts: diphenyliodonium trifluoromethanesulfonate, diphenyliodonium nonafluoro-n-butanesulfonate, diphenyliodonium pyrenesulfonate, diphenyliodonium dodecylbenzenesulfonate, diphenyliodonium hexafluoroantimonate, bis(4-t-butylphenyl)iodonium trifluoromethanesulfonate, bis(4-t-butylphenyl)iodonium nonafluoro-n-butanesulfonate, bis(4-t-butylphenyl) iodonium dodecylbenzenesulfonate, bis(4-t-butylphenyl) iodonium naphthalenesulfonate, bis(4-t-butylphenyl) iodonium hexafluoroantimonate, triphenylsulfonium trifluoromethanesulfonate, triphenylsulfonium nonafluoro-n-butanesulfonate, triphenylsulfonium hexafluoroantimonate, triphenylsulfonium naphthalenesulfonate, triphenylsulfonium camphorsulfonate, (hydroxyphenyl) benzenemethylsulfonium toluenesulfonate, cyclohexylmethyl(2-oxocyclohexyl)sulfonium trifluoromethanesulfonate, dicyclohexyl(2-oxocyclohexyl) sulfonium trifluoromethanesulfonate, dimethyl(2-oxo cyclohexyl)sulfonium trifluoromethanesulfonate, (4-hydroxyphenyl)benzylmethylsulfonium toluenesulfonate, 1-naphthyldimethylsulfonium trifluoromethanesulfonate, 1-naphthyldiethylsulfonium trifluoromethanesulfonate, 4-cyano-1-naphthyldimethylsulfonium trifluoromethane sulfonate, 4-nitro-1-naphthyldimethylsulfonium trifluoromethanesulfonate, 4-methyl-1-naphthyldimethyl sulfonium trifluoromethanesulfonate, 4-cyano-1-naphthyl diethylsulfoniun trifluoromethanesulfonate, 4-nitro-1-naphthyldiethylsulfonium trifluoromethanesulfonate, 4-methyl-1-naphthyldiethylsulfonium trifluoromethane sulfonate, 4-hydroxy-1-naphthyldimethylsulfonium trifluoromethanesulfonate, 4-hydroxy-1-naphthyltetrahydrothiophenium trifluoromethanesulfonate, 4-methoxy-1-naphthyltetrahydrothiophenium trifluoromethanesulfonate, 4-methoxy-1-naphthyltetrahydrothiophenium nonafluoro-n-butanesulfonate, 4-ethoxy-1-naphthyltetrahydrothiophenium trifluoromethanesulfonate, 4-methoxymethoxy-1-naphthyl tetrahydrothiophenium trifluoromethanesulfonate, 4-ethoxy methoxy-1-naphthyltetrahydrothiophenium trifluoromethane sulfonate, 4-(1'-methoxyethoxy)-1-naphthyltetrahydrothiophenium trifluoromethanesulfonate, 4-(2'-methoxyethoxy)-1-naphthyltetrahydrothiophenium trifluoromethanesulfonate, 4-methoxycarbonyloxy-1-naphthyltetrahydrothiophenium trifluoromethanesulfonate, 4-ethoxycarbonyl oxy-1-naphthyltetrahydrothiophenium trifluoromethane sulfonate, 4-n-propoxycarbonyloxy-1-naphthyltetrahydro thiophenium trifluoromethanesulfonate, 4-i-propoxy carbonyloxy-1-naphthyltetrahydrothiophenium trifluoromethanesulfonate, 4-n-butoxycarbonyloxy-1-naphthyltetrahydrothiophenium trifluoromethanesulfonate, 4-t-butoxycarbonyloxy-1-naphthyltetrahydrothiophenium trifluoromethanesulfonate, 4-(2'-tetrahydrofuranyloxy)-1-naphthyltetrahydrothiophenium trifluoromethanesulfonate, 4-(2'-tetrahydropyranyloxy)-1-naphthyltetrahydro thiophenium trifluoromethanesulfonate, 4-benzyloxy-1-naphthyltetrahydrothiophenium trifluoromethanesulfonate, 1-(naphthylacetomethyl)tetrahydrothiophenium trifluoromethane sulfonate, 4-cyclopentyloxy-1-naphtyltetrahydrothiophenium trifluoromethanesulfonate, and the like.

Halogen-containing compounds:

Haloalkyl group-containing hydrocarbon compounds, haloalkyl group-containing heterocyclic compounds, and the like can be given as halogen-containing compounds. Specific examples of preferable halogen-containing compounds include derivatives of (trichloromethyl)-s-triazine, such as phenyl-bis(trichloromethyl)-s-triazine, methoxyphenyl-bis(trichloromethyl)-s-triazine, and naphthyl-bis(trichloromethyl)-s-triazine; and 1,1-bis(4'-chlorophenyl-2,2,2-trichloroethane, and the like.

Diazoketone compounds:

As diazoketone compounds, 1,3-diketo-2-diazo compounds, diazobenzoquinone compounds, diazonaphthoquinone compounds, and the like can be given. Specific examples of preferable diazoketone compounds are 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,41-tetrahydroxybenzophenone, 1,2-naphthoquinonediazido-4-sulfonate or 1,2-naphthoquinonediazido-5-sulfonate or 1,1,1-tris(4'-hydroxyphenyl)ethane, and the like.

Sulfone compound:

As sulfone compounds, for example, β-ketosulfone, β-sulfonylsulfone, and α-diazo compounds of these sulfones can be given. Specific examples of preferable sulfone compounds are 4-trisphenacylsulfone, mesitylphenacylsulfone, bis(phenylsulfonyl)methane, and the like.

Sulfonic acid compound:

As sulfonic acid compounds, for example, alkyl sulfonate, alkyl sulfonic acid imide, haloalkyl sulfonate, aryl sulfonate, imino sulfonate and the like can be given. Specific examples of preferable sulfonic acid compounds include benzointosylate, tristrifluoromethane sulfonate of pyrogallol, nitrobenzyl-9,10-diethoxyanthracene-2-sulfonate, trifluoromethanesulfonylbicyclo[2.2.1]hepto-5-ene-2,3-dicarbodiimide, N-hydroxysuccinimide trifluoromethane sulfonate, 1,8-naphthalenedicarboxylic acid imide trifluoromethanesulfonate sulfone, and the like.

The following compounds are particularly preferable among these acid generator (B): diphenyliodonium trifluoromethanesulfonate, bis(4-t-butylphenyl)iodonium trifluoromethanesulfonate, bis(4-t-butylphenyl)iodonium nonafluoro-n-butanesulfonate, triphenylsulfonium trifluoromethanesulfonate, triphenylsulfonium nonafluoro-n-butanesulfonate, cyclohexylmethyl(2-oxocyclohexyl) sulfonium trifluoromethanesulfonate, dicyclohexyl(2-oxocyclohexyl)sulfonium trifluoromethanesulfonate, dimethyl(2-oxocyclohexyl)sulfonium trifluoromethanesulfonate, 4-hydroxy-1- naphthyldimethylsulfonium trifluoromethanesulfonate, 4-hydroxy-1-naphthyl-tetrahydrothiophenium trifluoromethanesulfonate, 4-methoxy-1-naphthyl-tetrahydrothiophenium nonafluoro-n-butanesulfonate, 1-(naphthylacetomethyl)tetrahydrothiophenium trifluoromethanesulfonate, trifluoromethanesulfonylbicyclo-[2.2.1]hepto-5-ene-2,3-dicarbodiimide, N-hydroxysuccinimide trifluoromethanesulfonate, 1,8-naphthalenedicarboxylic acid imide trifluoromethane sulfonate, and the like.

These acid generators (B) can be used either individually or in combinations of two or more in the composition of the first invention.

To optimize and balance sensitivity and developability as a resist, the amount of the acid generator (B) used in the composition of the present invention is usually from 0.1 to 10 parts by weight, and preferably from 0.5 to 7 parts by weight, for 100 parts by weight of the amount of the copolymer (A). If less than 0.1 part by weight, sensitivity and developability tend to be insufficient; if more than 10 parts by weight, on the other hand, the transparency to radiation of the resist tends to be impaired so that it is difficult to obtain a rectangular resist pattern.

Component (C)

The component (C) which is optionally used in the first invention is an alicyclic compound having a molecular weight of 1000 or less, which has an acid-decomposable organic group producing an acid functional group in the presence of an acid. Such a compound is hereinafter called "alicyclic compound (C)".

The groups previously described as examples for the acid-decomposable organic group (ii) can be used as the acid-decomposable organic group in the alicyclic compound (C)

To use the radiation sensitive resin composition in this embodiment as a chemically amplified resist, an ArF excimer laser (wavelength: 193 nm) or a KrF excimer laser (wavelength: 248 nm) can be preferably used as a radioactive ray.

The following compounds can be given as examples of the alicyclic compound (C) preferably used with an ArF excimer laser: adamantane compounds such as t-butyl adamantanecarboxylate, tetrahydropyranyl adamantanecarboxylate, 3-oxocyclohexyl adamantanecarboxylate, t-butoxycarbonylmethyl adamantanecarboxylate, mevalonolactone ester of adamantanecarboxylic acid, t-butyl 1-adamantylacetate, tetrahydropyranyl 1-adamantylacetate, 3-oxocyclohexyl 1-adamantylacetate, t-butoxycarbonylmethyl 1-adamantylacetate, mevalonolactone ester of adamantyl acetic acid, and the like; tricyclodecane compounds such as t-butyl tricyclodecanylcarboxylate, tetrahydropyranyl tricyclodecanylcarboxylate, 3-oxocyclohexyl tricyclodecanylcarboxylate, t-butoxycarbonylmethyl tricyclodecanylcarboxylate, mevalonolactone ester of tricyclodecanylcarboxylic acid, di-t-butyl tricyclodecanyldicarboxylate, ditetrahydropyranyl tricyclodecanyldicarboxylate, di-3-oxocyclohexyl tricyclodecanyldicarboxylate, di-t-butoxycarbonylmethyl tricyclodecanyldicarboxylate, dimevalonolactone ester of tricyclodecanyldicarboxylic acid, and the like; cholic acid compounds such as t-butyl cholate and the like; lithocholic acid compounds such as t-butyl lithocholate and the like; dihydrocholic acid compounds such as t-butyl dihydrocholate and the like; and deoxycholic acid compounds such as t-butyl deoxycholate and the like. Of these alicyclic compounds (C), t-butyl adamantanecarboxylate, t-butoxycarbonylmethyl adamantanecarboxylate, t-butyl 1-adamantylacetate, t-butoxycarbonylmethyl 1-adamantylacetate, t-butyl tricyclodecanecarboxylate, di-t-butyl tricyclodecanedicarboxylate, t-butyl cholate, t-butyl lithocholate, t-butyl dihydrocholate, t-butyl deoxycholate, and the like are desirable.

The above-described alicyclic compounds (C) can be used either individually or in combinations of two or more in this embodiment.

The amount of the alicyclic compound (C) used in the composition of this embodiment is usually from 5 to 50 parts by weight, preferably from 5 to 40 parts byweight, for 100 parts by weight of the copolymer (A) . If less than 5 parts by weigbt, the effect of improvement in the transparency to radiation tends to be insufficient; if more than 50 parts by weight, on the other hand, heat resistance and adhesion with substrates tend to be impaired.

Various additives

An acid diffusion control agent, which has a function of controlling diffusion of the acid generated from acid generator (B) by exposure in the resist film and suppressing undesirable chemical reactions in the unexposed area, is preferably added to the radiation sensitive resin composition of the first invention.

The addition of such an acid diffusion control agent not only improves storage stability and increases resolution as a resist of the resulting radiation sensitive resin composition, but also controls variation in the line-width in resist patterns due to process delayed time between exposure and development (Post Exposure Delay). A composition exhibiting superb process stability can be obtained by the addition of the acid diffusion control agent.

A nitrogen-containing organic compound of which the properties as a base is not affected by exposure or heating treatment during the step of forming resist patterns is desirable as an acid diffusion control agent.

As examples of such a nitrogen-containing organic compound, monoamino compounds, diamino compounds, polymers which possesses three or more nitrogen atoms, amide group-containing compounds, urea compounds, nitrogen-containing heterocyclic compounds, and the like can be given.

Given as specific examples of the above-mentioned monoamino compounds are mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, tri-n-dodecyl amine, n-dodecyl dimethylamine, and tricyclohexylamine; alkanol amines such as cyclohexyl-ethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine.

Given as examples of the above-mentioned diamino compounds are ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4'-aminophenyl)propane, 2-(3'-aminophenyl)-2-(4'-aminophenyl)propane, 2-(4'-aminophenyl)-2-(3'-hydroxyphenyl)propane, 2-(4'- aminophenyl)-2-(4'-hydroxyphenyl)propane, 1,4-bis[1'-(4"-aminophenyl)-1'-methylethyl]benzene, 1,3-bis[1'-(4"-aminophenyl)-1'-methylethyl]benzene, and the like.

As examples of the polymer having three or more nitorogen atoms, polymers such as polyethylene imine, polyallylamine, 2-dimethylaminoethyl acrylamide, and the like can be given.

As examples of the amide group-containing compounds, formamide, N-methylformamide, N,N-dimethylformamide, acetamide, N-methylacetamide, N,N-dimethylacetamide, propione amide, benzamide, pyrrolidone, N-methylpyrrolidone, and the like can be given.

As examples of the above-mentioned urea compounds, urea, methylurea, 1,1-dimethylurea, 1,3-dimethylurea, 1,1,3,3-tetramethylurea, 1,3-diphenylurea, tri-n-butylthiourea, and the like can be given.

As examples of the above-mentioned nitrogen-containing heterocyclic compounds, imidazole compounds such as imidazole, benzimidazole, 4-methylimidazole, and 4-methyl-2-phenylimidazole; pyridine compounds such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinic-acidamide, quinoline, 8-oxyquinoline, and acridine, as well as pyrazine, pyrazole, pyridazine, quinoxaline, purine, pyrrolidine, piperidine, morpholine, 4-methylmorpholine, piperazine, 1,4-dimethylpiperazine, 1,4-diazabicyclo[2.2.2]octane, and the like can be given.

Of these nitrogen-containing organic compounds, monoamino compounds, nitrogen-containing heterocyclic compounds are preferred. Among the monoamino compounds, tri(cyclo)alkylamines and alkanolamines are particularly preferred. Among the nitrogen-containing heterocyclic compounds, pyridines are particularly preferred.

The above-mentioned acid diffusion control agents can be used either individually or in combinations of two or more.

The amount of acid diffusion control agents incorporated in the composition of the present invention is usually 15 parts by weight or less, preferably from 0.001 to 10 parts by weight, and more preferably from 0.005 to 5 parts by weight, for 100 parts by weight of the copolymer (A). If the amount of acid diffusion control agent incorporated exceeds 15 parts by weight, sensitivity as a resist may decrease and development of the exposed area tends to be insufficient. If the amount of acid diffusion control agent incorporated is less than 0.001 part by weight, the pattern configuration and dimensional precision as a resist may be adversely affected depending on process conditions.

In addition to the above-described components, a surfactant which improves coatability, developability, and the like can optionally be incorporated into the radiation sensitive resin composition of the first invention.

Given as examples of such a surfactant are nonionic surfactants such as polyoxyethylene lauryl ether, polyoxyethylene stearyl ether, polyoxyethylene oleyl ether, polyoxyethylene octylphenyl ether, polyoxyethylene nonyl phenyl ether, polyethylene glycol dilaurate, and polyethylene glycol distearate, as well as products commercially available under the trademarks such as KP341 (manufactured by Shin-Etsu Chemical Co., Ltd.), Polyflow No. 75, Polyflow No. 95 (manufactured by Kyoeisha Yushi Co., Ltd.), F-Top EF301, F-Top EF303, F-Top EF352 (manufactured by Tokem Products Co., Ltd.), Megafax F171, Megafax F173 (manufactured by DIC Corp.), Flolada FC430, Flolade FC431 (manufactured by Sumitomo 3M Co., Ltd.), Asahi Guard AG710, Saflon S-382, Saflon SC-101, Saflon SC-102, Saflon SC-103, Saflon SC-104, Saflon SC-105, Saflon SC-106 (manufactured by Asahi Glass Co., Ltd.), and the like.

These surfactants can can be used either individually or in combinations of two or more.

The amount of surfactants incorporated is usually two parts by weight or less for 100 parts by weight of the total amount of the copolymer (A) and acid generator (B) or 100 parts by weight of the total amount of the copolymer (A), acid generator (B), and alicyclic compound (C).

Halation preventors, adhesion auxiliary agents, storage stabilizers, anti-foaming agents, and the like can be given as additives other than above-mentioned additives.

Preparation of composition solution

The radiation sensitive resin composition of the first invention is prepared as a solution by dissolving the solid components to a total solid concentration in the range usually from 5 to 50 wt %, preferably from 10 to 25 wt %, and filtering the mixture through a filter with a pore size of about 0.2 µm.

The following solvents are given as the solvent which can be used for such a composition solution: linear ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methyl-2-cyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; and various other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol mono-methyl ether acetate, ethylene glycol mono-ethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethoxyethyl acetate, hydroxyethyl acetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetoate, ethyl acetoacetate, methyl 3-methoxy propionate, ethyl 3-ethoxy propionate, methyl pyruvate, ethyl pyruvate, N-methyl pyrrolidone, N,N-dimethylformamide, N,N-dimethyl acetamide, benzyl ethyl ether, dihexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and the like.

These solvents can be used either individually or in combinations of two or more. Cyclic ketones, linear ketones, propylene glycol monoalkyl ether acetates, and alkyl 2-hydroxypropionates are particularly preferred solvents.

Method of Forming Resist Patterns

The radiation sensitive resin compositions of the first and second inventions are especially useful as chemically amplified positive tone resists.

In the chemically amplified positive tone resists, the acid-decomposable organic group (i) or (ii) in the copolymer (A) or alicyclic compound (C) decompose by the action of an acid which is produced from the acid generator (B) by exposure to radiation, thereby producing a carboxyl group, for example. This increases solubility of the exposed areas of the resist in an alkaline developer. The exposed areas are thus removed by being dissolved in the alkaline developer, leaving a positive tone resist pattern.

To prepare a resist pattern from the radiation sensitive resin composition of the first invention, the resin composition is applied on a substrate such as a silicone wafer, a wafer coated with aluminum, or the like by an appropriate coating means such as revolutionary application, cast coating, or roller coating. The resist film thus prepared is optionally subjected to a prebaking treatment (hereinafter called "PB treatment"), then exposed to radiation to form a prescribed resist pattern. An ArF excimer laser (wavelegth: 193 nm) or a KrF excimer laser (wavelegth: 248 nm) is preferable radioactive rays used in this step.

In the first invention, it is desirable to subject the exposed resist film to a post-exposure baking treatment (hereinafter called"PEB"). The PEB treatment ensures a smooth reaction for decomposition of the acid-decomposable organic group (i) or (ii). Although the PEB conditions differ depending on the proportion of the components in the radiation sensitive resin composition, heating in the PEB treatment is carried out at a temperature usually from 30 to 200° C., and preferably from 50 to 170° C.

To make the best use of potentiality of the radiation sensitive resin composition in the first invention an organic or inorganic anti-reflection film may be formed on the substrate prior to exposure to radiation, as disclosed in Japanese Patent Publication No. 12452/1994, for example. It is also possible to provide a protective overcoating over the resist film, as disclosed in Japanese Patent Application Laid-open No. 188598/1993, for example, to protect the resist film from the effect of basic impurities in the environmental atmosphere. These two techniques may be employed in combination. A desired resist pattern is then formed by developing the exposed areas on the resist film.

An alkaline aqueous solution in which one or more alkaline compounds are dissolved can be used as a developer. The alkaline compounds used here include sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, 1,5-diazabicyclo-[4.3.0]-5-nonene, and the like.

The concentration of the alkaline aqueous solution is usually 10 wt % or less. If the concentration of the alkaline aqueous solution is more than 10 wt %, unexposed areas may also be dissolved in the developer. The developer comprising the above-mentioned alkaline aqueous solution can also include an organic solvent.

Given as examples of such an organic solvent are ketones such as acetone, methyl ethyl ketone, methyl i-butyl ketone, cyclopentanone, cyclohexanone, 3-methyl-2-cyclopentanone, and 2,6-dimethylcyclohexanone; alcohols such as methyl alcohol, ethyl alcohol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-pentyl acetate; and aromatic hydrocarbons such as toluene, xylene, phenol, acetonylacetone, dimethylformamide, and the like.

These organic solvents can be used either individually or in combinations of two or more.

The amount of the organic solvents used is preferably less than 100 vol % of the amount of the alkaline aqueous solution. If the amount of the organic solvents exceeds 100 vol %, developability of the solution may decrease, leaving undeveloped parts in the exposed area.

Moreover, an appropriate amount of a surfactant and the like can be added to the developer which comprises alkaline aqueous solution as a major component.

The resist films are developed using such a developer, then usually washed with water.

II. Second Invention

Component(A')

The component (A') in the second invention is a polymer having the same recurring unit (I) shown by the formula (1) which is used as part of the essential recurring units for the component (A) in the first invention, and further having an alicyclic skeleton on the main chain (hereinafter called "polymer (A')").

Possession of the alicyclic skeleton in the main chain of the polymer (A') enables the radiation sensitive resin composition of the second invention to exhibit superior transparency, especially to radioactive rays, and superb dry etching resistance.

The polymer (A') can possess the acid-decomposable group (i) as the substitution groups A and/or B in the recurring unit (I) in the same way as in the first invention and may also contain one or more "other recurring unit".

In addition, in the same way as in the first invention, the polymer (A') may contain at least one recurring unit selected from a recurring unit obtained by the cleavage of a polymerizable carbon—carbon double bond of norbornene (bicyclo[2.2.1]hept-2-ene) or norbornene derivative having no acid-decomposable groups (hereinafter called "norbornene derivative (γ)"), or a recurring unit obtained by the cleavage of a polymerizable carbon—carbon double bond of a compound other than the norbornene or norbornene derivative (γ) (hereinafter called "monomer (δ)"). These recurring units are hereinafter collectively referred to as "other recurring units".

When the other recurring units originating from polymerizable unsaturated compounds in the polymer (A') contains the recurring units derived from norbornene or norbornene derivative (γ), the total amount of the recurring unit (I) and the recurring units originating from norbornene or norbornene derivative (γ) is usually 20 mol % or more, preferably 30 mol % or more, and more preferably 40 mol % or more. When the other recurring units originating from polymerizable unsaturated compounds in the polymer (A') are the recurring units derived from only norbornene derivative (δ), the amount of the recurring unit (I) is usually 20 mol % or more, preferably 30 mol % or more, and more preferably 40 mol % or more. In either case, if this amount is less than 20mol %, dry etching resistance as a resist tends to be insufficient.

In the former case, the percentage of the recurring unit (I) in the total amount of the recurring unit (I) and the recurring units originating from norbornene or norbornene derivative (γ) is usually 30 mol % or more, preferably 40 mol % or more, and more preferably 50 mol % or more.

The polymer (A') is prepared, for example, by the polymerization of at least one norbornene derivative (α) and at least one other polymerizable unsaturated compound using a radical polymerization initiator such as a hydroperoxide compound, dialkyl peroxide compound, diacyl peroxide compound, or azo compound in the presence of a suitable solvent.

As examples of the solvent used for the polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutane, bromohexane, dichloroethane, hexamethylene dibromide, and chlorobenzene; saturated carboxylic acid esters such as ethyl acetate, n-butyl acetate, i-butyl acetate, and methyl propionate; and ethers such as tetrahydrofuran, dimethoxyethane, and diethoxyethane can be given.

These solvents can be used either individually or in combinations of two or more.

The polystyrene-standardized weight average molecular weight (Mw) of the polymer (A') determined by the gel permeation chromatography (GPC) is usually from 3,000 to 300,000, preferably from 4,000 to 200,000, and more preferably from 5,000 to 100,000. If Mw of the polymer (A') is less than 3,000, heat resistance as a resist tends to decrease; if more than 300,000, on the other hand, developability as a resist tends to be insufficient.

In the present invention polymer (A') can be used either individually or in combinations of two or more.

The smaller the content of impurities such as halogen and metals in the polymer (A') used in the second invention, the better is the performance of the radiation sensitive resin composition, such as sensitivity and resolution as a resist, a process stability, and pattern configuration, and the like. As the method for purifying of the polymer (A'), chemical purification methods such as washing and liquid-liquid extraction, for example, and combinations of a chemical purification method with a physical method such as ultrafiltration, centrifugation, or the like, can be given.

Component (B')

The same compounds as the photoacid generator (B) which generate an acid by exposure to radiation used in the first invention can be used as the component (B') in the second invention.

Specifically, the component (B') (hereinafter referred to as "acid generator (B')") can liberate the acid-decomposable organic group in the polymer (A) or the organic group (Z) in the later-described androstane compound (C') by the action of an acid produced by exposure to radiation. As a result, the exposed area in the resist film is rendered easily soluble in an alkali developer, whereby a positive tone resist pattern is formed.

In the second invention, the acid generator (B') can be used either individually or in combinations of two or more.

To optimize and balance sensitivity and developability as a resist, the amount of the acid generator (B') used in the composition of the second invention is usually from 0.1 to 10 parts by weight, and preferably from 0 5 to 7 parts by weight, for 100 parts by weight of the amount of the polymer (A'). If less than 0.1 part by weight, sensitivity and developability tends to be insufficient; if more than 10 parts by weight, on the other hand, the transparency of the resist against radiation tends to be impaired so that it is difficult to obtain a rectangular resist pattern.

Component (C')

The component (C') in the second invention is an androstane-17-carboxylic acid ester compound which is shown by the above-mentioned formula (5) (hereinafter called "androstane compound (C')"). When this compound reacts with the acid which is generated by exposure to radiation, the group Z in the formula (5) decomposes to produce a carboxyl group or an acid-decomposable group in the group Z dissociates to produce a polar group, whereby the androstane compound (C') loses its capability of suppressing alkali solubility of the polymer (A') and rather acts to accelerate the alkali solubility of the polymer (A').

Given as examples of the alkoxyl group having 1–4 carbon atoms in the formula (5) represented by $R^5$, $R^6$, or $R^7$ are methoxy group, ethoxygroup, n-propoxygroup, i-propoxygroup, n-butoxy group, 2-methylpropoxy group, 1-methylpropoxy group, t-butoxy group, and the like; as examples of the alkyl carbonyloxy group having 2–5 carbon atoms, methyl carbonyloxy group, ethyl carbonyloxy group, n-propyl carbonyloxy group, i-propyl carbonyloxy group, n-butyl carbonyloxy group, 2-methylpropyl carbonyloxy group, 1-methylpropyl carbonyloxy group, t-butyl carbonyloxy group, and the like; as examples of the haloalkyl carbonyloxy group having 2–5 carbon atoms, fluoromethyl carbonyloxy group, trifluoromethyl carbonyloxy group, chloromethyl carbonyloxy group, trichloromethyl carbonyloxy group, bromomethyl carbonyloxy group, tribromomethyl carbonyloxy group, 2-fluoroethyl carbonyloxy group, 2-chloroethyl carbonyloxy group, 2-bromoethyl carbonyloxy group, 3-fluoropropyl carbonyloxy group, 3-chloropropyl carbonyloxy group, 3-bromopropyl carbonyloxy groups, 4-fluorobutyl carbonyloxy group, 4-chlorobutyl carbonyloxy group, 4-bromobutyl carbonyloxy group, and the like. Of these groups, methoxy group, ethoxy group, methyl carbonyloxy group, trifluoromethyl carbonyloxy group, trichloromethyl carbonyloxy group, tribromomethyl carbonyloxy group, and the like are preferred.

A hydrogen atom or hydroxyl group are particularly preferred as the groups $R^5$, $R^6$, and R7 in the formula (5).

Given as examples of the divalent organic groups having 1–10 carbon atoms represented by $R^8$ are $-CH_2-$, $-CH_2CH_2-$, $-CH_2CH_2CH_2-$, $-CH(CH_3)CH_2-$, $-CH_2CH_2CH_2CH_2-$, $-CH(CH_3)CH_2CH_2-$, $-CH_2CH_2CH_2CH_2CH_2-$, $-CH_2CH_2CH_2CH_2CH_2CH_2-$, $-CH_2CH_2CH_2CH_2CH_2CH_2CH_2-$, $-CH_2CH_2CH_2CH_2CH_2CH_2CH_2CH_2-$, $-CH_2CH_2CH_2CH_2CH_2CH_2CH_2CH_2CH_2-$, and $-CH_2CH_2CH_2CH_2CH_2CH_2CH_2CH_2CH_2CH_2-$.

Of these, $-CH_2-$, $-CH_2CH_2-$, $-CH_2CH_2CH_2-$, $-CH_2CH_2CH_2CH_2-$, and $-CH(CH_3)CH_2CH_2-$ are preferred, with the group $-CH(CH_3)CH_2CH_2-$ being ideal.

As the group Z, a monovalent oxygen-containing acid-decomposable organic group having 20 or less carbon atoms is preferable.

When the group Z of the androstane compound (C') has an oxygen atom and an acid-decomposable group, this acid-decomposable group dissociates by exposure to radiation and produces a polar group. This provides the radiation sensitive resin composition with polarity, which results in improvement in developing properties and increased adhesion to substrates.

The following groups can be given as examples of monovalent oxygen-containing acid-decomposable organic group having 20 or less carbon atoms (hereinafter called "acid-decomposable organic group (iii)"): (cyclo) alkoxycarbonyl methyl groups such as methoxycarbonylmethyl group, ethoxycarbonylmethyl group, n-propoxycarbonylmethyl group, i-propoxycarbonylmethyl group, n-butoxycarbonylmethyl group, 2-methylpropoxycarbonylmethyl group, 1-methylpropoxy carbonylmethyl group, t-butoxycarbonylmethyl group, cyclohexyloxycarbonylmethyl group, and 4-t-butylcyclohexyloxycarbonylmethyl group; aryloxycarbonylmethyl groups such as phenoxycarbonylmethyl group, 4-t-butylphenoxycarbonylmethyl group, and 1-naphthyloxycarbonylmethyl group; aralkyloxycarbonylmethyl groups such as benzyloxycarbonylmethyl group, 4-t-butylbenzyloxycarbonylmethyl group, phenethyloxycarbonylmethyl group, and 4-t-butylphenethyloxycarbonylmethyl group; 2-(cyclo) alkoxycarbonylethyl groups such as 2-methoxycarbonylethyl group, 2-ethoxycarbonylethyl group, 2-n-propoxycarbonylethyl group, 2-i-propoxycarbonylethyl group, 2-n-butoxycarbonylethyl group, 2-(2'-methylpropoxy)carbonylethyl group, 2-(1'-methylpropoxy)carbonylethyl group, 2-t-butoxycarbonylethyl group, 2-cyclohexyloxycarbonylethyl group, and 2-(4'-t-butylcyclohexyloxycarbonyl)ethyl group; 2-aryloxycarbonylethyl groups such as 2-phenoxycarbonylethyl group, 2-(4'-t-butylphenoxycarbonyl)ethyl group, and 2-(1'-naphthyloxycarbonyl)ethyl group; 2-aralkyloxycarbonylethyl group such as 2-benzyloxycarbonylethyl group, 2-(4'-t-butylbenzyloxycarbonyl)ethyl group, 2-phenethyloxycarbonylethyl group, and 2-(4'-t-butylphenethyloxycarbonyl)ethyl group; (cyclo) alkoxymethyl groups such as methoxymethyl group, ethoxymethyl group, n-propoxymethyl group, i-propoxymethyl group, n-butoxymethyl group, 2-methylpropoxymethyl group, 1-methylpropoxymethyl group, t-butoxymethyl group, cyclohexyloxymethyl group, and 4-t-butylcyclohexyloxymethyl group; 2-(cyclo) alkoxyethyl groups such as 2-methoxyethyl group, 2-ethoxyethyl group, 2-n-propoxyethyl group, 2-i-propoxyethyl group, 2-n-butoxyethyl group, 2-(2'-methylpropoxy)ethyl group, 2-(1'-methylpropoxy)ethyl group, 2-t-butoxyethyl group, 2-cyclohexyloxyethyl group, and 2-(4'-t-butylcyclohexyloxy)ethyl group; and tricyclodecanyloxymethyl group, 2-tricyclodecanyloxyethyl group, 3-oxocyclohexyl group, tetrahydrofuranyl group, tetrahydropyranyl group, 2-oxo-4-methyl-4-tetrahydropyranyl group, and the like.

Of these, t-butoxycarbonylmethyl group, 2-ethoxyethyl group, 2-cyclohexyloxyethyl group, 3-oxocyclohexyl group, tetrahydropyranyl group, 2-oxo-4-methyl-4-tetrahydropyranyl group, and the like are particularly preferred.

To use the radiation sensitive resin compositions in this embodiment as a chemically amplified resist, an ArF excimer laser (wavelength: 193 nm) or a KrF excimer laser (wavelength: 248 nm) can preferably be used as a radioactive ray.

As specific examples of preferable androstane compounds (C') used with such excimer lasers, 3-oxocyclohexyl cholate, 3-oxocyclohexyl dihydrocholate, tetrahydropyranyl cholate, t-butoxycarbonylmethyl cholate, cholic acid mevalonolactone ester, tetrahydropyranyl dihydrocholate, t-butoxycarbonylmethyl dihydrocholate, dihydrocholic acid mevalonolactone ester, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, mevalolactone deoxycholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, mevalonolactone lithocholate, and the like can be given.

The androstane compounds (C') can be used either individually or in combinations of two or more in the second invention.

The amount of the androstane compounds (C') used in the composition of the second invention is usually from 5 to 50 parts by weight, preferably from 10 to 30 parts by weight, for 100 parts by weight of the copolymer (A). If less than 5 parts by weight, the effect of improvement in the transparency to radiation tends to be insufficient; if more than 50 parts by weight, on the other hand, heat resistance and adhesion with substrates tend to be impaired.

The same various additives as previously mentioned in connection with the first invention can be incorporated in the composition of the second invention. In addition, the same methods as in the first invention can be employed for preparing the composition solution of the second invention and for forming a resist pattern by using this composition solution.

The radiation sensitive resin composition of the present invention (the first invention and second invention) thus prepared exhibits superior transparency to radioactive rays and has a sufficient dry etching resistance as a chemically amplified resist. In addition, the composition exhibits an excellent property balance including such properties as high resolution, excellent pattern configuration capability, and superb sensitivity. The resin composition of the present invention is thus an ideal material for the manufacture of semi-conductor devices in which further microminiaturization is anticipated in the future.

This invention is explained in more detail below referring to embodiment examples; however, this invention should not be construed to be limited therein.

EXAMPLES

In the following descriptions, "parts" and "%" respectively indicate "parts by weight" and "wt %".

Measurement of the weight average molecular weight (Mw) in the following Synthesis Examples were carried out by gel permeation chromatography (GPC) using mono-dispersion polystyrene as a standard, and using a GPC column (G2000 HXL×2, G3000HXL×1, G4000HXL×1) manufactured by Tosoh Corp. The following analytical conditions were used:

Flow rate: 1.0 ml/min

Elution solvent: tetrahydrofuran

Column temperature: 40° C.

Synthesis Example 1

(1) Synthesis of 8-methyl-8-methoxycarbonyltetracyclo[4.4.0.1$^{2,5}$.1$^{7,10}$]dodec-3-ene A 50 liter reaction vessel equipped with a stirrer maintained at a temperature of 180° C. and pressure of 3.5 kg/cm$^2$.G was continuously charged with a mixture of methyl methacrylate, dicyclopentadiene, and 5-methyl-5-methoxycarbonylbicyclo[2.2.1]hept-2-ene, at a ratio of 1:2.4 (cyclopentadiene base):2.4, at a feed rate of 4 kg/hour, so that the average residence time of the reaction raw materials in the reaction vessel was maintained 8 hours. As a polymerization inhibitor, a solution of p-methoxyphenol in methyl methacrylate was added in an amount of 300 ppm (weight base) of the total amount of the reaction raw materials.

During the reaction, the reaction product was removed from the reaction vessel at a rate of 4 kg per hour and continuously supplied to a flash distillation column which was maintained at a temperature of 105° C. and a pressure of 300 Torr, to separate out a portion of unreacted raw materials.

The distillate from the flash distillation column was continuously fed to a distillation column with a diameter of 3 inches, packed with fillers (Throuser Packing BX™, manufactured by Sumitomo Heavy Industries, Ltd.) to a height of 119 cm in the concentration section and 102 cm in the recovery section. The distillation column was operated at the column top pressure of 5 Torr and reflux ratio of 1, while removing from the column top unreacted raw materials which were not separated from the flash distillation column and 8-methyl-8-methoxycarbonyltetracyclo[$4.4.0.1^{2,5}.1^{7,10}$] dodec-3-ene of the the following formula (10) from the column bottom at an yield of 67%.

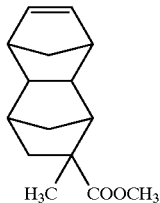

(10)

H$_3$C   COOCH$_3$ (2) Hydrolysis 100 parts of 8-methyl-8-methoxycarbonyltetracyclo [$4.4.0.1^{2,5}.1^{7,10}$]dodec-3-ene, 200 parts of propylene glycol, 10 parts of distilled water, and 50 parts of potassium hydroxide were placed in a flask. A hydrolysis reaction was carried out for 4 hours in a nitrogen atmosphere at 120° C. After cooling, an aqueous solution of oxalic acid di-hydrate in an amount of 1.1 equivalent of the potassium hydroxide was added dropwise to coagulate the reaction product as 8-methyltetracyclo[$4.4.0.1^{2,5}.1^{7,10}$]dodec-3-ene-8-carboxylic acid of the following formula (11) at an yield of 95%.

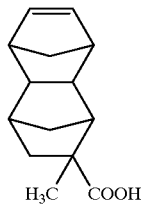

(11)

H$_3$C   COOH (3) Introduction of protective group 100 parts of 8-methyltetracyclo[$4.4.0.^{2,5}.1^{7,10}$]dodec-3-ene-8-carboxylic acid, 200 parts of tetrahydrofuran, 200 parts of distilled water, 52 parts of t-butyl α-bromoacetate, and 41 parts of potassium carbonate were placed in a flask. The mixture was stirred for 6 hours in a nitrogen atmosphere while refluxing. Next, 200 parts of ethyl acetate, 400 parts distilled water, and 45 parts of oxalic acid di-hydrate were added and the mixture was stirred, then allowed to stand to separate an organic layer. The organic layer was washed several times with water and dried under vacuum to quantitatively obtain 8-methyl-8-t-butoxycarbonyl methoxycarbonyltetracyclo[$4.4.0.1^{2,5}.1^{7,10}$]dodec-3-ene of the following formula (12).

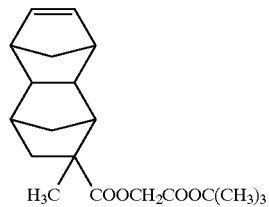

(12)

H$_3$C   COOCH$_2$COOC(CH$_3$)$_3$

Synthesis Example 2

(1) Synthesis of 8-acetoxytetracyclo[$4.4.0.1^{2,5}.1^{7,10}$]dodec-3-ene

The reaction was carried out in the same manner as in the Synthesis Example 1(1), except for using vinyl acetate, dicyclopentadiene, and 5-acetoxycarbonylbicyclo[2.2.1] hept-2-ene at a molar ratio of 3:1(as cyclopentadiene):1 as reaction raw materials, to obtain 8-acetoxytetracyclo [$4.4.0.1^{2,5}.1^{7,10}$]dodec-3-ene of the following formula (13) at an yield of 36%.

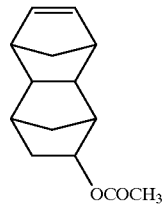

(13)

OCOCH$_3$ (2) Hydrolysis 100 parts of 8-acetoxytetracyclo[$4.4.0.1^{2,5}.1^{7,10}$]dodec-3-ene, 200 parts of 1,4-dioxane, 50 parts of distilled water, and 50 parts of potassium hydroxide were placed in a flask. A hydrolysis reaction was carried out for 4 hours in a nitrogen atmosphere at 100° C. After cooling, an aqueous solution of oxalic acid di-hydrate in an amount of 1.1 equivalent of the potassium hydroxide was added dropwise to coagulate the reaction product. The coagulate was washed with a large amount of water, then washed with a small amount of toluene, and dried to obtain 8-hydroxytetracyclo [$4.4.0.1^{2,5}.1^{7,10}$]dodec-3-ene of the following formula (14) at an yield of 95%.

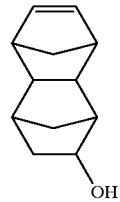

(14)

OH

Synthesis Example 3

A separable flask equipped with a reflux condenser was charged with 29 parts of 8-methyl-8-t- butoxycarbonylmethoxycarbonyltetracyclo[4.4.0.1$^{2,5}$.1$^{7,10}$]dodec-3-ene, 10 parts of 8-hydroxytetracyclo[4.4.0.1$^{2,5}$.1$^{7,10}$]dodec-3-ene, 18 parts of maleic anhydride, 4 parts of 2,5-dimethyl-2,5-hexanedioldiacrylate, 1 part of t-dodecylmercaptan, 4 parts of azobisisobutyronitrile, and 60 parts of 1,2-diethoxyethane. The polymerization reaction was carried out for 6 hours at 70° C. in a nitrogen stream. After the polymerization, a large amount of mixed solvent of n-hexane and i-propyl alcohol (weight ratio=1:1) was added to the reaction solution to coagulate the resin. The resin was washed several times with the same mixed solvent and dried under vacuum to obtain a copolymer with an Mw of 27,000 at an yield of 60%. The copolymer contained the recurring units shown by the following formulas (15-1), (15-2), and (15-3) in the amount of 64 mol %, 18 mol %, and 18 mol %, respectively. This copolymer is hereinafter called copolymer (A-1).

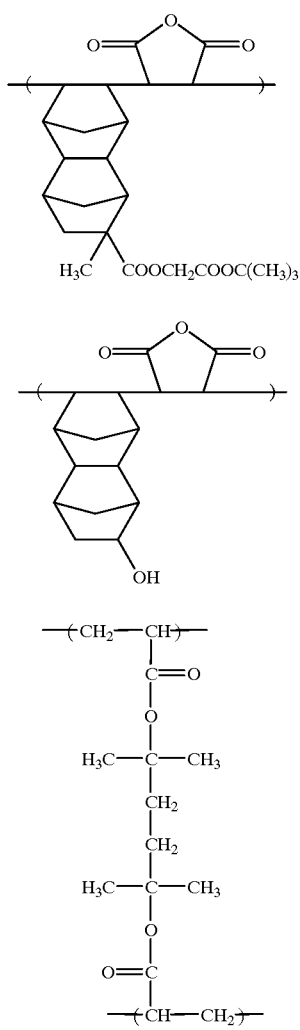

Synthesis Example 4

(1) Synthesis of 8-t-butoxycarbonyltetracyclo[4.4.0.1$^{2,5}$.1$^{7,10}$]dodec-3-ene The reaction was carried out in the same manner as in the Synthesis Example 1(1), except for using t-butyl acrylate, dicyclopentadiene, and 5-t-butoxycarbonylbicyclo[2.2.1]hept-2-ene at a molar ratio of 3:1(as cyclopentadiene):1 as reaction raw materials, to obtain 8-t-butoxycarbonyltetracyclo[4.4.0.1$^{2,5}$.1$^{7,10}$]dodec-3-ene of the following formula (16) at an yield of 40%.

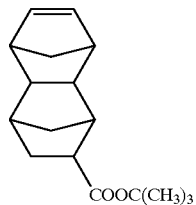

Synthesis Example 5

A separable flask equipped with a reflux condenser was charged with 44 parts of 8-t-butoxycarbonyltetracyclo[4.4.0.1$^{2,5}$.1$^{7,10}$]dodec-3-ene, 16 parts of maleic anhydride, 11 parts of 2,5-dimethyl-2,5-hexanediol diacrylate, 4.5 parts of t-dodecylmercaptan, 5 parts of azobisisobutyronitrile, and 60 parts of 1,2-diethoxyethane. The polymerization reaction was carried out for 6 hours at 70° C. in a nitrogen stream. After the polymerization, a large amount of a mixed solvent of n-hexane and i-propyl alcohol (weight ratio=1:1) was added to the reaction solution to coagulate the resin. The resin was washed several times with the same mixed solvent and dried under vacuum to obtain a copolymer with an Mw of 18,000 at an yield of 70%. The copolymer contained the recurring units shown by the following formulas (17–1) and (17–2) in the amount of 82 mol % and 18 mol %, respectively. This copolymer is hereinafter called copolymer (A-2).

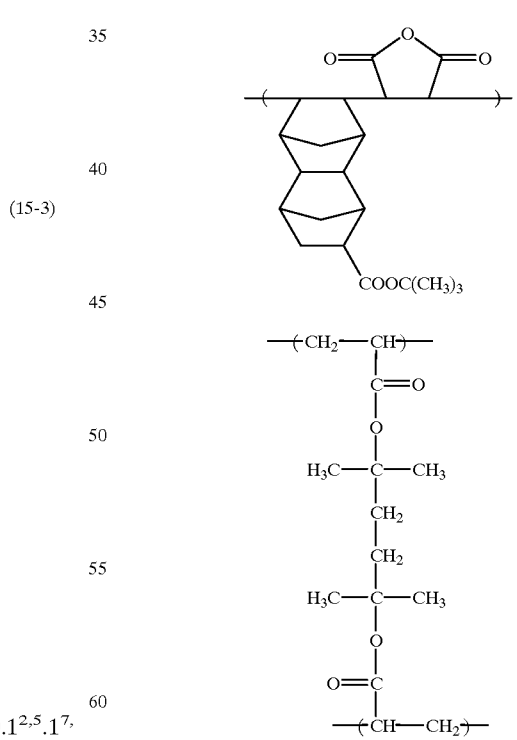

Synthesis Example 6

(1) Polymerization

A separable flask equipped with a reflux condenser was charged with 44 parts of 8-t-butoxycarbonyltetracyclo

[4.4.0.1$^{2,5}$.1$^{7,10}$]dodec-3-ene, 25 parts of 2-hydroxypropyl acrylate, 3 parts of 2,5-dimethyl-2,5-hexanediol diacrylate, 5 parts of dimethyl-2,2'-azobis(2-methylpropionate), and 60 parts of 1,2-diethoxyethane The polymerization reaction was carried out for 6 hours at 70° C. in a nitrogen stream. After the polymerization, a large amount of n-hexane was added to the reaction solution to coagulate the resin. The resin was washed several times with n-hexane and dried under vacuum to obtain a copolymer with an Mw of 15,000 at an yield of 70%. The copolymer contained the recurring units shown by the following formulas (18-1), (18-2), and (18-3) in the amount of 60 mol %, 35 mol %, and 5 mol %, respectively. This copolymer is hereinafter called copolymer (A-3).

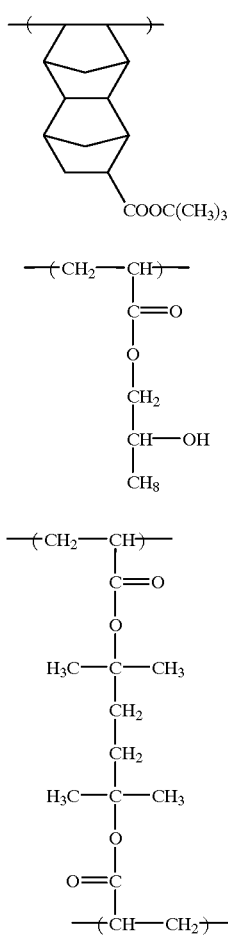

(18-1)

(18-2)

(18-3)

Synthesis Example 7

(1) Synthesis of 8-methyl-8-hydroxymethyltetracyclo [4.4.0.1$^{2,5}$.1$^{7,10}$]dodec-3-ene 37.6 g of lithium aluminum hydride and 800 ml of tetrahydrofuran were added to a flask and maintained at 0° C. in a nitrogen atmosphere. Then, 200 g of 8-methyl-8-methoxycarbonyltetracyclo[4.4.0.1$^{2,5}$.1$^{7,10}$]dodec-3-ene dissolved in 200 ml of tetrahydrofuran was added from a dripping funnel over one hour, followed by a reaction for 2.5 hours at 70° C. The reaction solution was allowed to cool to room temperature and a 10% aqueous solution of potassium hydroxide was added gradually, followed by further addition of 10% aqueous solution of hydrochloric acid. The reaction solution was then extracted with toluene and the reaction product was salted out from saturated brine. The salt-out product was washed several times with water and dried over anhydrous magnesium sulfate. Toluene was evaporated to obtain 145 g of a white solid of 8-methyl-8-hydroxymethyltetracyclo[4.4.0.1$^{2,5}$.1$^{7,10}$]dodec-3-ene shown by the following formula (19).

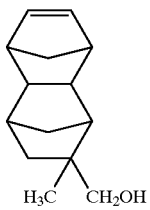

(19)

Synthesis Example 8

A separable flask equipped with a reflux condenser was charged with 131.97 parts of 5-t-butoxycarbonylnorbornene, 34.67 parts of 8-methyl-8-hydroxymethyltetracyclo [4.4.0.1$^{2,5}$.1$^{7,10}$]dodec-3-ene, 83.33 parts of maleic anhydride, 43.2 parts of 2, 5-dimethyl-2, 5-hexanediol diacrylate, 10 parts of azobisisobutyronitrile, and 425.15 parts of 1,2-diethoxyethane. The polymerization reaction was carried out for 8 hours at 70° C. in a nitrogen stream. After the polymerization, a large amount of a mixed solvent of n-hexane and i-propyl alcohol (weight ratio=1:1) was added to the reaction solution to coagulate the resin. The resin was washed several times with the same mixed solvent and dried under vacuum to obtain a copolymer with an Mw of 901,000, a ratio Mw/Mn of 18.5, a content of low molecular weight components of 8% and a residual monomer content of less than 0.5%. The yield was 65%. The copolymer contained the recurring units shown by the following formulas (20-1), (20-2), (20-3), and (20-4) in the amount of 36 mol %, 9 mol %, 45 mol %, and 10 mol %, respectively. This copolymer is hereinafter called copolymer (A-4).

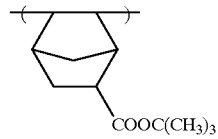

(20-1)

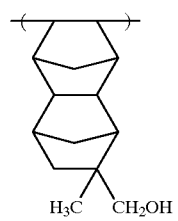

(20-2)

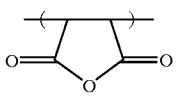

(20-3)

-continued (20-4)

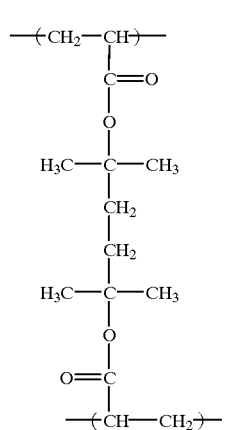

Synthesis Example 9

A separable flask equipped with a reflux condenser was charged with 131.97 parts of 5-t-butoxycarbonyl-2-norbornene, 34.67 parts of 8-methyl-8-hydroxymethyltetracyclo-[4.4.0.1$^{2,5}$.1$^{7,10}$]dodec-3-ene prepared in Synthesis Example 7 (1), 83.33 parts of maleic anhydride, 43.2 parts of 2,5-dimethyl-2,5-hexanediol diacrylate, 20 parts of dimethyl-2,2'-azoiso-butyrate, and 425.15 parts of 1,2-diethoxyethane. The polymerization reaction was carried out in a nitrogen stream for 12 hours at 70° C. and additional two hours at 90° C. After the polymerization, a large amount of n-hexane was added to the reaction solution to coagulate the resin. The resin was washed several times with n-hexane and dried under vacuum to obtain a copolymer with an Mw of 352,000, a ratio Mw/Mn of 26.5, a content of low molecular weight components of 5% and a residual monomer content of less than 0.5%. The yield was 70%. The copolymer contained the recurring units shown by the above-described formulas (20-1), (20-2), (20-3), and (20-4) in the amount of 35 mol %, 9 mol %, 45 mol %, and 11 mol %, respectively. This copolymer is hereinafter called copolymer (A-5).

Synthesis Example 10

A separable flask equipped with a reflux condenser was charged with 69.72 parts of 8-t-butoxycarbonyltetracyclo [4.4.0.1$^{2,5}$.1$^{7,10}$]dodec-3-ene, 26.28 parts of maleic anhydride, 17.98 parts of 2,5-dimethyl-2,5-hexanediol diacrylate, 5 parts of 2-acetoxyethyl methacrylate, 4.9 parts of 3-mercaptopropionic acid, 8 parts of dimethyl-2,2'-azoisobutyrate, and 100 parts of 1,2-diethoxyethane. The polymerization reaction was carried out for 8 hours at 70° C. in a nitrogen stream. After the polymerization, a large amount of a mixed solvent of n-hexane and i-propyl alcohol (weight ratio=1:1) was added to the reaction solution to coagulate the resin. The resin was washed several times with the same mixed solvent and dried under vacuum to obtain a copolymer with an Mw of 13,000, a ratio Mw/Mn of 2.2, a content of low molecular weight components of 2% and a residual monomer content of 0%. The yield was 70%. The copolymer contained the recurring units shown by the following formulas (21-1), (21-2), (21-3), and (21-4) in the amount of 43 mol %, 43 mol %, 11 mol %, and 3 mol %, respectively. This copolymer is hereinafter called copolymer (A-6)

(21-1)

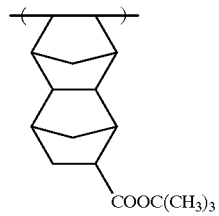

(21-2)

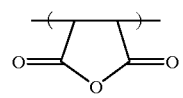

(21-3)

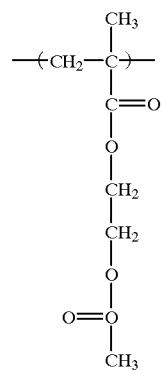

(21-4)

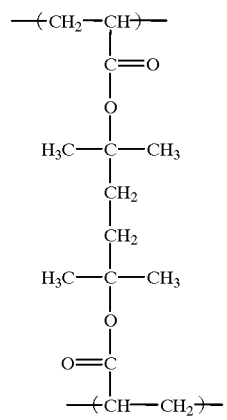

Synthesis Example 11

(1) Synthesis of 8-methoxycarbonyltetracyclo[4.4.0.1$^{2,5}$.1$^{7,10}$]dodec-3-ene 8-methoxycarbonyltetracyclo[4.4.0.1$^{2,5}$.1$^{7,10}$]dodec-3-ene of the following formula (22) was prepared in a yield of 55% in the same manner as in Synthesis Example 1(1) except for using methyl acrylate as a reaction raw material.

(22)

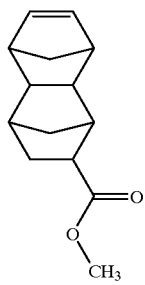

(2) Hydrolysis

Tetracyclo[4.4.0.1$^{2,5}$.1$^{7,10}$]dodec-3-ene-8-carboxylic acid of the following formula (23) was almost quantitatively synthesized in the same manner as in Synthesis Example 1(2).

(23)

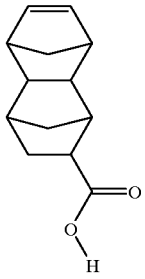

(3) Introduction of functional group 170 parts of α-bromo-γ-butyrolactone, 110 parts of triethylamine, and 200 parts of tetracyclo[4.4.0.1$^{2,5}$.1$^{7,10}$]dodec-3-ene-8-carboxylic acid were reacted in dry tetrahydrofuran for 24 hours at room-temperature. After the reaction, tetrahydrofuran was evaporated and ethyl acetate was added, followed by washing several times with a saturated aqueous solution of sodium hydrogencarbonate. The resulting product was purified by silica gel column chromatography to obtain tetracyclo[4.4.0.1$^{2,5}$.1$^{7,10}$]dodec-3-ene-8-(γ-butyrolactone-2-yl)carboxylate of the following formula (24) at an yield of 80%.

(24)

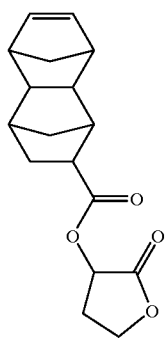

Synthesis Example 12

In the same manner as in Synthesis Example 3, 130 parts of 5-t-butoxycarbonyl-2-norbornene, 50 parts of tetracyclo[4.4.0.1$^{2,5}$.1$^{7,10}$]dodec-3-ene-8- (γ-butyrolactone-2-yl) carboxylate, 80 parts of maleic anhydride, 20 parts of 2,5-dimethyl-2,5-hexanedioldiacrylate, and 10 parts of azoiso-butylonitrile were dissolved in 450 parts of butyl acetate and polymerized to obtain a copolymer having the recurring units of the following formulas (25-1), (25-2), (25-3), and (25-4) in the amount of 36 mol %, 10 mol %, 46 mol %, and 8 mol %, respectively. The copolymer had an Mw of 30,000, a ratio Mw/Mn of 14.2, a content of low molecular weight components of 5%, and a residual monomer content of less than 0.5%. The yield was 73%. This copolymer is hereinafter called copolymer (A-25).

(25-1)

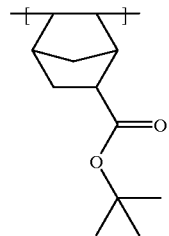

(25-2)

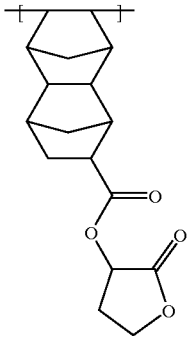

(25-3)

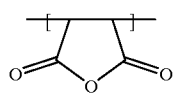

(25-4)

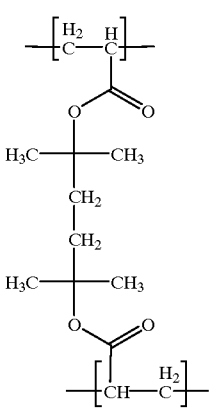

Synthesis Example 13

The experiment was carried out in the same manner as in Synthesis Example 7, except for using 8-methoxycarbonyltetracyclo[4.4.0.1$^{2,5}$.1$^{7,10}$]dodec-3-ene which was prepared in Synthesis Example 11 as a reaction raw material to obtain 8-hydroxymethyltetracyclo[4.4.0.1$^{2,5}$.1$^{7,10}$]dodec-3-ene of the following formula (26) at an yield of 90%.

(26)

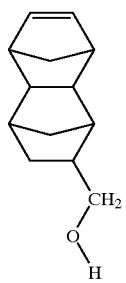

Synthesis Example 14

In the same manner as in Synthesis Example 3, 53 parts of 5-t-butoxycarbonyl-2-norbornene, 34 parts of 8-hydroxymethyltetracyclo[4.4.0.1$^{2,5}$.1$^{7,10}$]dodec-3-ene, 34 parts of maleic anhydride, 8 parts of 2,5-dimethyl-2,5-hexanediol diacrylate, and 10 parts of azoisobutylonitrile were dissolved in 160 parts of butyl acetate and polymerized to obtain a copolymer having the recurring units of the following formulas (27-1), (27-2), (27-3), and (27-4) in the amount of 37 mol %, 9 mol %, 46 mol %, and 8 mol %, respectively. The copolymer had an Mw of 52,000, a ratio Mw/Mn of 17.2, a content of low molecular weight components of 7%, and a residual monomer content of less than 0.5%. The yield was 75%. This copolymer is hereinafter called copolymer (A-27).

(27-1)

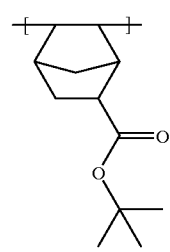

(27-2)

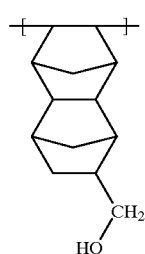

(27-3)

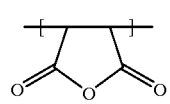

(27-4)

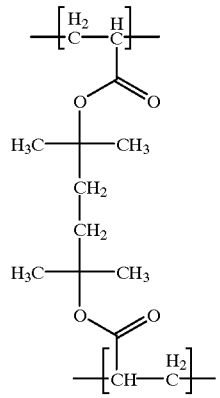

Synthesis Example 15

2.5 g of adamantane-1,3-dicarboxylic acid was dissolved in 25 ml of THF, followed by the addition of 6.3 ml of trifluoroacetic acid anhydride in a nitrogen atmosphere while cooling with ice so as not to raise the temperature. After the reaction, the product was stirred overnight to cool to the room temperature. 50 ml of saturated aqueous solution of sodium hydrogencarbonate and 50 ml ethyl acetate were added to the reaction solution to neutralize unreacted carboxylic acid components and dissolve the neutralized substance in the water layer, thereby extracting the reaction products in the organic layer. After washing with the saturated aqueous solution sodium hydrogencarbonate, ethyl acetate was evaporated from the organic layer. The resulting product was purified by silica gel column chromatography to obtain 3.0 g of di-t-butyladamantane-1,3-dicarboxylate of the following formula (28). This compound is hereinafter called compound (C-1).

(28)

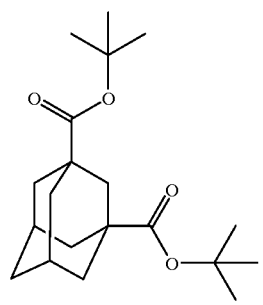

Synthesis Example 16

In the same manner as in Synthesis Example 15, 2.5 g of adamantane-1,3-diacetic acid was reacted with 5.6 ml of trifluoroacetic acid anhydride and 30 ml of diacetone alcohol to produce 4.4 g of di-t-butyladamantane-1,3-dicetate of the following formula (29). This compound is hereinafter called compound (C-2)

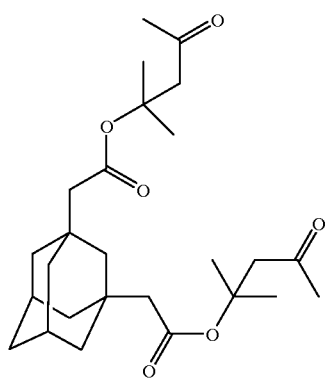

(29)

Synthesis Example 17

In the same manner as in Synthesis Example 15, 4.5 g of cholic acid was reacted with 25 ml of trifluoroacetic acid anhydride and 80 ml of t-butyl alcohol to produce 4 g of t-butyl cholate of the following formula (30). This compound is hereinafter called compound (C-3).

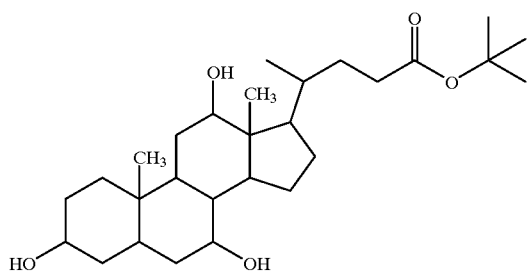

(30)

Synthesis Example 18

2.5 g of adamantane-1,3-dicarboxylic acid, 3.68 g of potassium carbonate, 4.55 g of t-butyl α-bromoacetate, and 36 mg of tetrabutylammonium bromide were dissolved in a mixed solution of 15 ml of THF and 15 ml of water. The mixture was reacted for 8 hours while refluxing. The organic layer was extracted with ethyl acetate and the extract was purified by column chromatography to obtain 4.2 g of di(t-butoxycarbonyloxymethyl)adamantane-1,3-dicarboxylate of the following formula (31). This compound is hereinafter called compound (C-4).

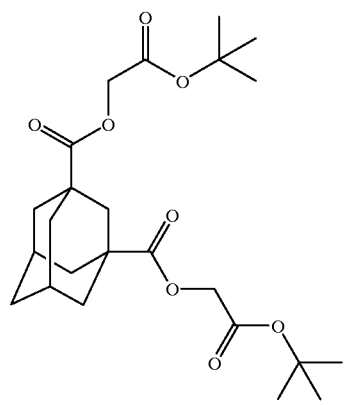

(31)

Synthesis Example 19

In the same manner as in Synthesis Example 18, 2.5 g of adamantane-1,3-diacetic acid was reacted with 3.28 g of potassium carbonate, 4.05 g of t-butyl α-bromoacetate, and 36 mg of tetrabutylammonium bromide in a mixed solvent of 15 ml of THF and 15 ml of water to produce 4.0 g of di(t-butoxycarbonyloxymethyl)adamantane-1,3-diacetate of the following formula (32). This compound is hereinafter called compound (C-5).

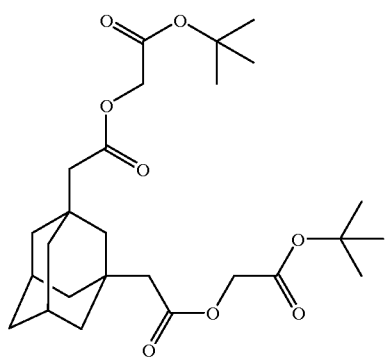

(32)

Synthesis Example 20

19.6 g of 4,8-bis(hydroxymethyl)tricyclo[$5.2.1.0^{2,6}$] decane, 22 g of succinic anhydride, and 2.0 g of N,N-dimethylaminopyridine were dissolved in 50 ml of THF and allowed to stand overnight at room temperature. THF was evaporated from the resction product and the residue was purified by column chromatography to obtain succinic acid half ester dicarboxylate of 4,8-bis(hydroxymethyl)tricyclo [$5.2.1.0^{2,6}$]decane. In the same manner as in Synthesis Example 18, t-butoxycarbonyl methyl group was introduced into this dicarboxylic acid to obtain 30 g of a compound of the following formula (33). This compound is hereinafter called compound (C-6).

(33)

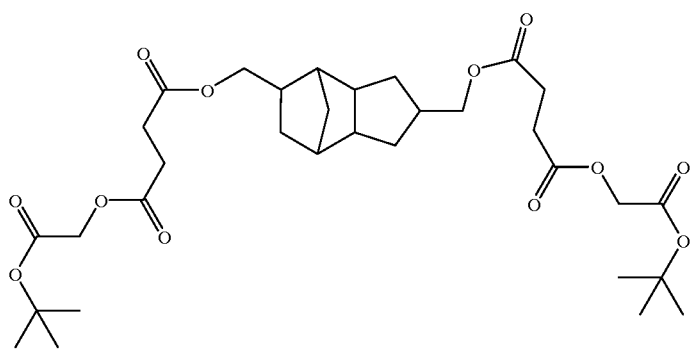

Synthesis Example 21

A separable flask equipped with a reflux condenser was charged with 200 parts of tetrahydrofuran and 200 parts of distilled water. 100 parts of deoxycholic acid, 57 parts of t-butyl α-bromoacetate, and 40 parts of potassium carbonate were dissolved in the mixture and reacted for 18 hours in a nitrogen stream while refluxing. The reaction solution was cooled to room temperature, followed by the addition of 400 parts of ethyl acetate and 400 parts of distilled water to separate the water layer. The organic layer was washed twice with 10% aqueous solution of potassium hydroxide to remove unreacted deoxycholic acid. The reaction product was washed three times with distilled water and the solvent was evaporated. The residue was dried under vacuum to obtain a product which solidifies into a white solid at a low temperature at an yield of 96%. $^1$H-NMR analysis identified that the solid is t-butoxycarbonylmethyl ester of deoxycholic acid having the following formula (32). This compound is designated hereinafter as androstane compound (C'-1).

(34)

![Structure 34]

Synthesis Example 22

The same procedure as in Synthesis Example 21 was carried out, except for using lithocholic acid instead of deoxycholic acid to obtain a white solid at an yield of 96%. $^1$H-NMR analysis identified that the solid is t-butoxycarbonylmethyl ester of lithocholic acid of the following formula (35). This compound is designated hereinafter as androstane compound (C'-2).

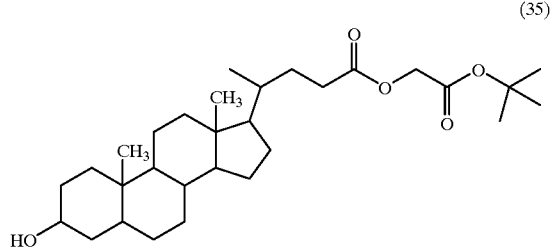

(35)

Synthesis Example 23

A separable flask equipped with a reflux condenser was charged with 15 g of deoxycholic acid and 100 ml of tetrahydrofuran. 11 mol of trifluoroacetic acid was gradually added dropwise while cooling the flask with ice. The ice water bath was removed and the mixture was allowed to stand to raise its temperature to room temperature, followed by stirring for 3 hours. Then, 5 g of mevalonolactone dissolved in 10 ml of tetrahydrofuran was gradually added dropwise while again cooling the flask with ice. After the addition, the temperature was raised to room temperature and the mixture was reacted for 8 hours. The reaction solution thus obtained was neutralized with 10% aqueous solution of sodium hydrogencarbonate and the reaction product was extracted with ethyl acetate. The solvent was removed to obtain a white solid. The solid was dissolved in 50 ml of tetrahydrofuran, and 50 ml of 10% aqueous solution of sodium hydrogencarbonate was added to carry out a hydrolysis reaction for 8 hours while refluxing. The reaction product was extracted with ethyl acetate, the solvent was evaporated, the resulting solid was recrystallized from ethyl acetate/in-hexane to obtain a white solid at an yield of 80%. $^1$H-NMR analysis confirmed that this solid was mevalonolactone ester of deoxycholic acid shown by the following formula (36). This compound is designated as androstane compound (C'-3).

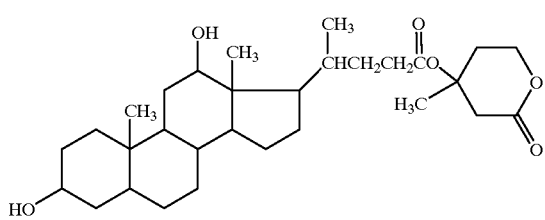

(36)

Synthesis Example 24

The same procedure as in Synthesis Example 5 was carried out, except for using lithocholic acid instead of deoxycholic acid, to obtain a white solid at an yield of 80%. 1H-NMR analysis confirmed that this solid was mevalonolactone ester of lithocholic acid shown by the following formula (37). This compound is designated as androstane compound (C'-4).

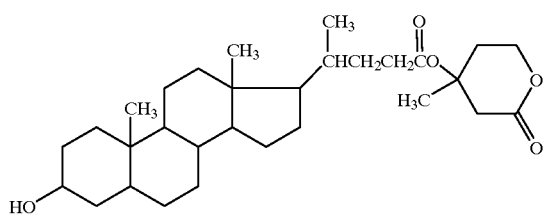

(37)

Synthesis Example 25

The same procedure as in Synthesis Example 15 was carried out, except that deoxycholic acid was used instead of adamantane-1,3-dicarboxylic acid and diacetone alcohol was used instead of t-butyl alcohol as the raw reaction materials, to obtain 2-methyl-3-oxopentyl deoxycholate of the following formula (38). This compound is designated as androstane compound (C'-5).

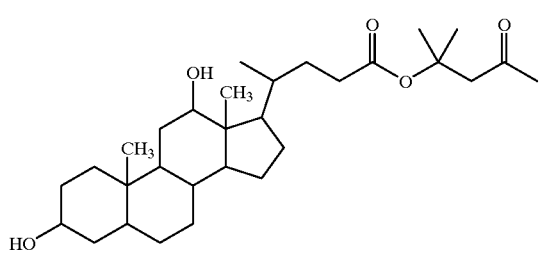

(38)

Synthesis Example 26

(1) Addition and hydrolysis 22 parts of 8-methoxycarbonyltetracyclo[4.4.0.1$^{2,5}$.1$^{7,10}$] dodec-3-ene which was prepared in Synthesis Example 11 and 5 parts of formic acid were dissolved in 50 parts of THF and reacted for two hours while refluxing. After having been allowed to cool to room temperature, 50 parts of 10% aqueous solution of potassium hydroxide was added, and the mixture was reacted for two hours while refluxing. Then, 10% aqueous solution of hydrochloric acid was added to produce a white solid, which was filtered, washed with a large amount of distilled water, and dried to obtain a white solid of 8(9)-hydroxytetracyclo[4.4.0.1$^{2,5}$.1$^{7,10}$]dodecane-2-carboxylic acid shown by the following formula (39) at an yield of 92%.

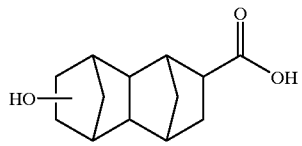

(39)

(2) Esterification reaction

The same procedure as in Synthesis Example 18 was carried out, except that 8(9)-hydroxytetracyclo[4.4.0.1$^{2,5}$.1$^{7,10}$]dodecane-2-carboxylic acid was used instead of adamantane-1,3-dicarboxylic acid as a raw material to obtain almost quantitatively t-butoxycarbonylmethyl ester of 8(9)-hydroxytetracyclo[4.4.0.1$^{2,5}$.1$^{7,10}$]dodecane-2-carboxylic acid shown by the following formula (40). This compound is designated as androstane compound (C'-6).

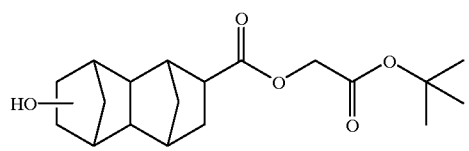

(40)

Example 1–13 and Comparative Example 1

Composition solutions were prepared according to the formulations shown in Table 1.

TABLE 1

(Unit in parentheses: part by weight)

| | Copolymer (A) | Acid generator (B) | Alicyclic compound (C) or androstane compound (C') | Acid diffusion controlling agent | Solvent |
|---|---|---|---|---|---|
| Example 1 | A-1 (80) | B-1 (1.5) | C'-2 (20) | D-2 (0.04) | E-3 (533) |
| Example 2 | A-2 (83) | B-3 (1.5) | C'-1 (17) | D-1 (0.04) | E-4 (533) |
| Example 3 | A-1 (100) | B-2 (1.5) | — (0) | D-2 (0.07) | E-1/E-2 (276/323) |
| Example 4 | A-3 (80) | B-1 (1.5) | C'-2 (20) | D-2 (0.04) | E-3 (560) |
| Example 5 | A-3 (100) | B-3 (1.5) | — (0) | D-2 (0.04) | E-4 (580) |
| Example 6 | A-4 (83) | B-3 (1.5) | C'-1 (17) | D-2 (0.04) | E-1/E-2 (160/360) |
| Example 7 | A-4 (88) | B-3 (1.2) | C'-1 (12) | D-2 (0.02) | E-2/E-3 (260/260) |
| Example 8 | A-4 (95) | B-3 (1.2) | C'-1 (5) | D-2 (0.02) | E-1/E-2 (320/370) |
| Example 9 | A-5 (95) | B-3/B-4 (1.2/0.5) | C'-1 (5) | D-2 (0.02) | E-3 (510) |
| Example 10 | A-5 (88) | B-3 (1.2) | C'-1 (12) | D-1 (0.02) | E-1/E-2 (180/390) |
| Example 11 | A-6 (83) | B-3 (1.2) | C'-1 (17) | D-1 (0.02) | E-1/E-2 (140/320) |
| Example 12 | A-6 (93) | B-3 (1.2) | C'-1 (7) | D-1 (0.02) | E-3 (470) |
| Example 13 | A-5 (88) | B-3 (1.2) | C'-1 (12) | D-1 (0.02) | E-1/E-2 (180/390) |
| Example 14 | A-1 (80) | B-1 (1.2) | C'-1 (20) | D-1 (0.04) | E-3 (533) |
| Example 15 | A-2 (83) | B-2 (1.0) | C'-3 (17) | D-2 (0.04) | E-4 (533) |
| Example 16 | A-1 (80) | B-3 (1.0) | C'-1 (20) | D-1 (0.07) | E-1/E-2 (276/323) |
| Example 17 | A-2 (80) | B-3 (1.0) | C'-3 (20) | D-2 (0.04) | E-3 (560) |
| Example 18 | A-5 (80) | B-3 (1.5) | C'-3 (20) | D-1 (0.04) | E-4 (533) |
| Example 19 | A-7 (80) | B-1 (2.5) | C-1 (20) | D-3 (0.1) | E-4 (533) |
| Example 20 | A-8 (80) | B-5 (2.5) | C-4 (20) | D-4 (0.1) | E-1/E-2 (180/390) |
| Example 21 | A-1 (80) | B-6 (2.5) | C-2 (20) | D-4 (0.1) | E-1/E-2 (180/390) |
| Example 22 | A-3 (85) | B-3/B-4 (1.2/0.5) | C-6 (15) | D-4 (0.1) | E-1/E-2 (180/390) |
| Example 23 | A-5 (85) | B-3/B-6 (1.2/0.5) | C-5 (15) | D-4 (0.1) | E-4 (533) |
| Example 24 | A-5 (80) | B-1/B-4 (1.2/1.2) | C-3 (20) | D-3 (0.1) | E-4 (533) |
| Example 25 | A-7 (95) | B-3 (1.7) | C-7 (5) | D-3 (0.07) | E-4 (533) |
| Example 26 | A-8 (83) | B-2 (1.7) | C'-5 (17) | D-3 (0.07) | E-4 (533) |
| Example 27 | A-8 (100) | B-2 (1.7) | — (0) | D-3 (0.07) | E-4 (533) |
| Comparative Example 1 | Resin X (100) | B-3 (1.5) | — (0) | D-1 (0.04) | E-4 (533) |
| Comparative Example 2 | Resin X (80) | B-3 (1.5) | C'-3 (20) | D-1 (0.04) | E-4 (533) |

The abbreviation for the components other than the copolymers (A) and alicyclic compounds (C) are as follows:

Resin X: Copolymer of methyl methacrylate/t-butyl methacrylate/methacrylic acid (40/40/20), Mw=30,000

(B-1): 4-Methoxy-1-naphthyltetrahydrothiophenium nonafluoro-n-butanesulfonate (41)

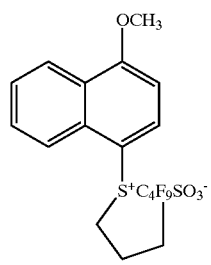

(B-2): Bis(4-t-butylphenyl)iodonium nonafluoro-n-butanesulfonate (42)

(B-3): Triphenylsulfonium nonafluoro-n-butanesulfonate (43)

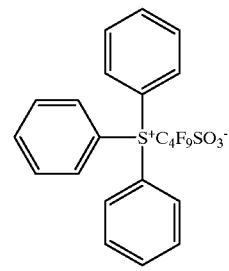

(B-4): Triphenylsulfonium trifluoromethanesulfonate (44)

(B-5): 4-n-Butoxy-1-napthyltetrahydrothiophenium nonafluoro-n-butanesulfonate (45)

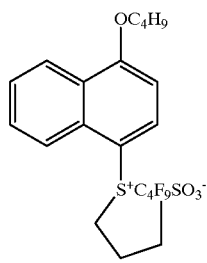

(B-6): Trifluoromethanesulfonylbicyclo[2.2.1]hept-5-ene-2,3-dicarbodiimide (46)

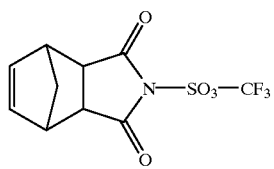

(D-1): N-cyclohexylethanolamine
(D-2): Tri-n-octylamine
(D-3): N,N,N',N'-Tetrakis(2-hydroxypropyl)ethylenediamine
(D-4): Bis(2-dimethylaminoethyl)ether
(E-1): Cyclohexanone
(E-2): 2-Heptanone
(E-3): Propylene glycol monomethyl ether
(E-4): Ethyl 2-hydroxypropionate Radiation transmittance, relative etching rate, pattern configuration, sensitivity, and resolution of the films prepared from these compositions were evaluated according to the following methods.

Radiation transmittance:

Films with a dry thickness of 0.5 μm produced by spin-coating the composition solutions on quartz glass plates were used. Radiation transmittance calculated from the absorbance at a wavelength of 193 nm was used as a scale for transparency in a deep ultraviolet ray region.

Relative etching rate:

Dry etching was performed on films with a dry film thickness of 0.5 μm produced by spin-coating the composition solutions on a quartz glass plate using a dry etching equipment Pinnacle 8000™, High Density Plasma, manufactured by PMT Co., Ltd. under the following conditions:

Etching gas: $CF_4$
Gas flow rate: 75 sccm,
Pressure: 2.5 mTorr,
Output: 2500 W

The relative etching rate of a sample was evaluated from the relative value to the etching rate of a cresol novolak resin film. The smaller the etching rate, more excellent is the etching resistance.

Pattern configuration:

A bottom size (L1) and top size (L2) of a square cross section of a line-and-space pattern (1L1S) with a 0.2 μm line width were measured using a scanning electron microscope. The pattern configuration was judged "good", when the inequality $0.85 \leq L2/L1 \leq 1$ was satisfied and the pattern configuration has no skirt-like foot.

Sensitivity:

Compositions of Examples 1–7, 10, 11 and Comparative Examples 1 and 2

The composition solutions were spin-coated onto silicone wafers and pre-baked under the PB conditions shown in Table 2 to obtain resist films with a thickness of 0.5 μm. The resist films were exposed to radiation through a mask pattern using an ArF excimer laser exposure apparatus (a lens numerical aperture: 0.60, exposure wavelength: 193 nm) manufactured by Integrated Solutions, Inc. The samples were subjected to a post exposure treatment on a hotplate under the PEB conditions shown in Table 2. The samples were then developed for one minute at 25° C. in an aqueous solution of tetramethylammonium hydroxide (TMAH) with a concentration shown in Table 2, washed with water, and dried to obtain positive tone resist patterns. An optimum dose of exposure to form a 1:1 line width from a line-and-space pattern (1L1S) with a line width 0.18 μm was taken as the sensitivity.

Compositions of Examples 8, 9, 12, and 19–27

Deep UV-30-6L manufactured by Brewer Science Co. was applied on a silicone wafer and baked to produce an organic anti-reflective coating material with a thickness 550 Å. The composition solutions were spin-coated onto the organic anti-reflective coating material and pre-baked under the PB conditions shown in Table 2 to obtain resist films with a thickness of 0.5 μm. The resist films were exposed to radiation through a mask pattern using an ArF excimer laser exposure apparatus (a lens numerical aperture: 0.60, exposure wavelength: 193 nm) manufactured by Integrated Solutions, Inc. The samples were then subjected to a post exposure treatment on a hotplate under the PEB conditions shown in Table 2. The samples were then developed for one minute at 25° C. in an aqueous solution of tetramethylammonium hydroxide (TMAH) with a concentration shown in Table 2, washed with water, and dried to obtain positive tone resist patterns. An optimum dose of exposure to form a 1:1 line-width from a line-and-space pattern (1L1S) with a line width 0.18 μm was taken as the sensitivity.

Example 13

Deep UV-30-6L manufactured by Brewer Science Co. was applied on a silicone wafer and baked to produce an organic reflection preventive film with a thickness 550 Å. The composition solutions were spin-coated onto the organic anti-reflective coating material and pre-baked under the PB conditions shown in Table 2 to obtain resist films with a thickness of 0.4 μm. The resist films were exposed to radiation through an alternating phase shift mask using an ArF excimer laser exposure apparatus (a lens numerical aperture: 0.60, exposure wavelength: 193 nm) manufactured by Integrated Solutions, Inc. The samples were then subjected to a post exposure treatment on a hotplate under the PEB conditions shown in Table 2. The samples were then developed for one minute at 25° C. in an aqueous solution of tetramethylammonium hydroxide (TMAH) with a concentration shown in Table 2, washed with water, and dried to obtain positive tone resist pattern. An dose of exposure which could resolute a line-and-space pattern (1L1S) with a minimum line width was taken as the sensitivity. ARC in Table 2 indicates a bottom layer of anti-reflective coating material.

Resolution:

The size of a minimum resist pattern obtained when exposed with optimum dose of exposure was taken as resolution.

The results of the evaluation are shown in Table 3.

TABLE 2

|  | PB Conditions | | PEB Conditions | | TMAH | Film | |
| --- | --- | --- | --- | --- | --- | --- | --- |
|  | Temp. (° C.) | Time (Sec.) | Temp. (° C.) | Time (Sec.) | Conc. (N) | thickness (μm) | Type of substrate |
| Example 1 | 130 | 90 | 130 | 90 | 0.26 | 0.5 | Si |
| Example 2 | 130 | 90 | 130 | 90 | 0.26 | 0.5 | Si |
| Example 3 | 140 | 90 | 140 | 90 | 0.26 | 0.5 | Si |
| Example 4 | 130 | 90 | 130 | 90 | 0.26 | 0.5 | Si |
| Example 5 | 140 | 90 | 130 | 90 | 0.26 | 0.5 | Si |
| Example 6 | 140 | 90 | 140 | 90 | 0.26 | 0.5 | Si |
| Example 7 | 140 | 90 | 140 | 90 | 0.26 | 0.5 | Si |
| Example 8 | 140 | 90 | 140 | 90 | 0.26 | 0.5 | ARC |
| Example 9 | 125 | 90 | 130 | 90 | 0.26 | 0.5 | ARC |
| Example 10 | 145 | 90 | 145 | 90 | 0.26 | 0.5 | Si |
| Example 11 | 140 | 90 | 140 | 90 | 0.26 | 0.5 | Si |
| Example 12 | 130 | 90 | 130 | 90 | 0.26 | 0.5 | ARC |
| Example 13 | 140 | 90 | 140 | 90 | 0.26 | 0.4 | ARC |
| Example 14 | 140 | 90 | 140 | 90 | 0.26 | 0.5 | SI |
| Example 15 | 140 | 90 | 140 | 90 | 0.26 | 0.5 | Si |
| Example 16 | 140 | 90 | 140 | 90 | 0.26 | 0.5 | Si |
| Example 17 | 140 | 90 | 140 | 60 | 0.26 | 0.5 | Si |
| Example 18 | 140 | 90 | 140 | 90 | 0.26 | 0.5 | Si |
| Example 19 | 140 | 90 | 140 | 90 | 0.26 | 0.5 | ARC |
| Example 20 | 140 | 90 | 140 | 90 | 0.26 | 0.5 | ARC |
| Example 21 | 140 | 90 | 140 | 90 | 0.26 | 0.5 | ARC |
| Example 22 | 140 | 90 | 140 | 90 | 0.26 | 0.5 | ARC |
| Example 23 | 140 | 90 | 140 | 90 | 0.26 | 0.5 | ARC |
| Example 24 | 140 | 90 | 140 | 90 | 0.26 | 0.5 | ARC |
| Example 25 | 140 | 90 | 140 | 90 | 0.26 | 0.5 | ARC |
| Example 26 | 140 | 90 | 140 | 90 | 0.26 | 0.5 | ARC |
| Example 27 | 140 | 90 | 140 | 90 | 0.26 | 0.5 | ARC |
| Comparative Example 1 | 140 | 90 | 140 | 90 | 0.26 | 0.5 | Si |
| Comparative Example 2 | 140 | 90 | 140 | 90 | 0.26 | 0.5 | Si |

TABLE 3

|  | Radiation transmittance (193 nm) (%) | Relative etching rate | Pattern configuration | Sensitivity (mJ/cm²) | Resolution (mm) |
| --- | --- | --- | --- | --- | --- |
| Example 1 | 66 | 1.41 | Good | 20 | 0.15 |
| Example 2 | 52 | 1.38 | Good | 18 | 0.15 |
| Example 3 | 50 | 1.44 | Good | 15 | 0.15 |
| Example 4 | 68 | 1.33 | Good | 17 | 0.15 |
| Example 5 | 54 | 1.40 | Good | 26 | 0.15 |
| Example 6 | 57 | 1.35 | Good | 15 | 0.14 |
| Example 7 | 52 | 1.33 | Good | 12 | 0.14 |
| Example 8 | 47 | 1.40 | Good | 16 | 0.14 |
| Example 9 | 45 | 1.40 | Good | 9 | 0.14 |
| Example 10 | 58 | 1.30 | Good | 10 | 0.13 |
| Example 11 | 53 | 1.30 | Good | 11 | 0.14 |
| Example 12 | 51 | 1.32 | Good | 18 | 0.14 |
| Example 13 | 52 | 1.31 | Good | 14 | 0.09 |
| Example 14 | 56 | 1.35 | Good | 15 | 0.15 |
| Example 15 | 52 | 1.40 | Good | 12 | 0.15 |
| Example 16 | 50 | 1.38 | Good | 13 | 0.15 |
| Example 17 | 58 | 1.42 | Good | 12 | 0.15 |
| Example 18 | 62 | 1.41 | Good | 10 | 0.14 |
| Example 19 | 61 | 1.40 | Good | 12 | 0.14 |
| Example 20 | 64 | 1.33 | Good | 12 | 0.14 |
| Example 21 | 65 | 1.35 | Good | 12 | 0.14 |
| Example 22 | 62 | 1.33 | Good | 10 | 0.14 |
| Example 23 | 62 | 1.40 | Good | 14 | 0.14 |
| Example 24 | 68 | 1.36 | Good | 13 | 0.14 |
| Example 25 | 58 | 1.38 | Good | 10 | 0.14 |
| Example 26 | 55 | 1.35 | Good | 11 | 0.14 |
| Comparative Example 1 | 68 | 2.2 | footing | 23 | 0.25 |
| Comparative Example 2 | 68 | 2.2 | footing | 23 | 0.30 |

The results in Table 3 shows that the radiation sensitive resin compositions of the first invention exhibits high dry etching resistance, superb resolution, and superior transparency to radioactive rays of 50% or more, and produces excellent pattern configuration at a high sensitivity.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition which comprises, (A) a polymer containing, (a) a recurring unit (I) of the following formula (1):

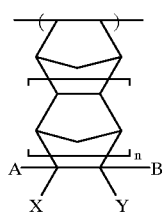

(1)

wherein A and B individually represent a hydrogen atom or an acid-decomposable organic group having 20 or less carbon atoms which dissociates in the presence of an acid and produces an acidic functional group, provided that either one of A and B is the acid-decomposable organic group, X and Y individually represent a hydrogen atom or an alkyl group having 1–4 carbon atoms, and n is 0 or 1, or a recurring unit (I) of the above formula (1) and a recurring unit (II) of the following formula (2),

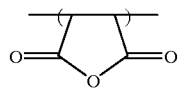

(2)

and
(b) a recurring unit (III) which is derived from a monomer having at least two polymerizable carbon—carbon double bonds by cleavage of the carbon—carbon double bonds, wherein the monomer has, in addition to said at least two polymerizable carbon—carbon double bonds, at least one acid-decomposable divalent group of the following formula (3) or (4),

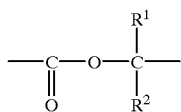

(3)

wherein $R^1$ and $R^2$ are individually an alkyl group having 1–5 carbon atoms,

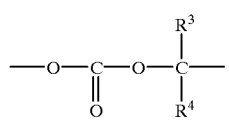

(4)

wherein $R^3$ and $R^4$ are individually an alkyl group having 1–5 carbon atoms,
said at least two polymerizable carbon—carbon double bonds being linked via the least one acid-decomposable divalent group of the formula (3) or (4), and
(B) a photoacid generator.

2. The radiation-sensitive resin composition according to claim 1, further comprising,
(C) an alicyclic compound having a molecular weight of 1000 or less, which has an acid-decomposable organic group producing an acid functional group in the presence of an acid.

3. A radiation-sensitive resin composition which comprises,
(A') a polymer containing a recurring unit (I) shown by the following formula (1),

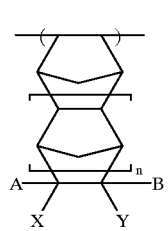

(1)

wherein A and B individually represent a hydrogen atom or an acid-decomposable organic group having 20 or less carbon atoms which dissociates in the presence of an acid and produces an acidic functional group, provided that either one of A and B is the acid-decomposable organic group, X and Y individually represent a hydrogen atom or an alkyl group having 1–4 carbon atoms, and n is 0 or 1,
(B') a photoacid generator, and
(C') an androstane-17-carboxylic acid ester compound of the following formula (5),

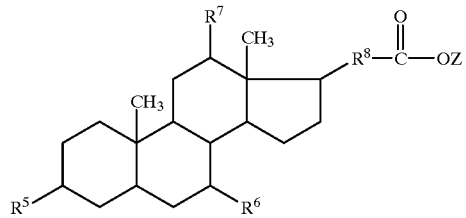

wherein $R^5$, $R^6$, and $R^7$ are individually a hydrogen atom, a hydroxyl group, an alkoxyl group having 1–4 carbon atoms, alkyl carbonyloxy group having 2–5 carbon atoms, or a haloalkyl carbonyloxy group having 2–5 carbon atoms, $R^8$ is a divalent organic group having 1–10 carbon atoms, and Z is selected from the group consisting of a (cyclo) alkoxycarbonyl methyl group, an aryloxycarbonylmethyl group, an aralkyloxycarbonylmethyl group, a 2-(cyclo) alkoxycarbonylethyl group, a 2-aryloxycarbonylethyl group, a 2-aralkyloxycarbonylethyl group, a (cyclo) alkoxymethyl group, and a 2-(cyclo)galkoxyethyl group.

4. The radiation-sensitive resin composition according to claim 1, wherein the acid-decomposable organic group in the recurring unit (I) of the above formula (1) is a group —COOR', wherein R' is a (cyclo)alkyl group with 1–19 carbon atoms, or a group —COOCH$_2$COOR", wherein R" is a (cyclo)alkoxycarbonylmethyl group with 1–17 carbon atoms.

5. The radiation-sensitive resin composition according to claim 1, wherein the acid-decomposable organic group in the recurring unit (I) of the above formula (1) is at least one group selected from the group consisting of 1-methylpropoxycarbonyl group, t-butoxycarbonyl group, and t-butoxycarbonylmethoxycarbonyl group.

6. The radiation-sensitive resin composition according to claim 1, wherein the monomer from which the recurring unit (III) is derived is a compound synthesized by an esterification reaction of a polyol having at least one tertiary hydroxyl group and a monovalent carboxylic acid having a polymerizable carbon—carbon double bond.

7. The radiation-sensitive resin composition according to claim 6, wherein the polyol having at least one tertiary hydroxyl group is a compound of the following formula (7), (8), or (9):

wherein R has the same meaning as the $R^1, R^2, R^3$, or $R^4$ previously defined in the formula (3) or (4), and two or more R may be identical or different from each other, $R^9$ indicates an organic group with a valence of i, provided that $R^9$ is a single bond when i=2, and i is an integer of 2 to 4,

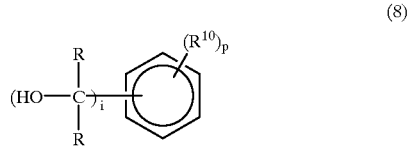

wherein R has the same meaning as the $R^1$, $R^2$, $R^3$, or $R^4$ previously defined in the formula (3) or (4), and two or more R may be identical or different from each other, $R^{10}$ indicates an alkyl group having 1–5 carbon atoms, with two or more $R^{10}$, if present, being either identical or different from each other, j is an integer from 2 to 4, and p is an integer from 0 to 4, provided that j+p≦6, or

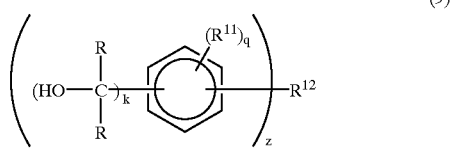

wherein R has the same meaning as the $R^1$, $R^2$, $R^3$, or $R^4$ previously defined in the formula (3) or (4), and two or more R may be identical or different from each other, $R^{11}$ indicates an alkyl group having 1–5 carbon atoms, with two or more $R^{11}$, if present, being either identical or different from each other, $R^{12}$ indicates an organic group with a valence of z, —O—, —S—, —CO—, or —SO$_2$—, k is an integer of 1 or 2, q is an integer of 0–3, and z is an integer of 2–4.

8. The radiation-sensitive resin composition according to claim 1, wherein the monomer from which the recurring unit (III) is derived is 2,5-dimethyl-2,5-hexanediol diacrylate.

9. The radiation-sensitive resin composition according to claim 1, wherein the copolymer (A) comprises 30 to 99 mol % of the recurring unit (I) and 1 to 70 mol % of the recurring unit (III).

10. The radiation-sensitive resin composition according to claim 1, wherein the copolymer (A) comprises 30 to 60 mol % of the recurring unit (I) 30 to 69 mol % of the recurring unit (II), and 1 to 40 mol % of the recurring unit (III).

11. The radiation-sensitive resin composition according to claim 1, wherein the copolymer (A) has a ratio of polystyrene-standardized weight average molecular weight to polystyrene-standardized number average molecular weight, (Mw)/(Mn), of 1.5 to 100.

12. The radiation-sensitive resin composition according to claim 1, wherein the ratio of the area occupied by the components with Mw of less than 2,000 in the gel permeation chromatogram of the copolymer (A) is 30% or less.

13. The radiation-sensitive resin composition according to claim 1, wherein the content of the acid generator (B) is from 0.1 to 10 parts by weight for 100 parts by weight of the amount of the copolymer (A).

14. The radiation-sensitive resin composition according to claim 1, wherein the alicyclic compound (C) is at least one compound selected from the group consisting of t-butyl adamantanecarboxylate, t-butoxycarbonylmethyl adamantanecarboxylate, t-butyl 1-adamantylacetate, t-butoxycarbonylmethyl 1-adamantylacetate, t-butyl tricyclodecanylcarboxylate, t-butyl cholate, t-butyl lithocholate, t-butyl dihydrocholate, and t-butyl deoxycholate.

15. The radiation-sensitive resin composition according to claim 1, further comprising a nitrogen-containing organic compound as an acid diffusion control agent.

16. The radiation-sensitive resin composition according to claim 1, wherein the polymer (A') has a polystyrene standardized weight average molecular weight of 3,000 to 300,000.

17. The radiation-sensitive resin composition according to claim 3, wherein the acid-decomposable organic group in the recurring unit (I) of the above formula (1) is a group —COOR", wherein R' is a (cyclo)alkyl group with 1–19 carbon atoms, or a group —COOCH$_2$COOR", wherein R" is a (cyclo)alkoxycarbonylmethyl group with 1–17 carbon atoms.

18. The radiation-sensitive resin composition according to claim 3, wherein the acid-decomposable organic group in the recurring unit (I) of the above formula (1) is at least one group selected from the group consisting of 1-methylpropoxycarbonyl group, t-butoxycarbonyl group, and t-butoxycarbonylmethoxycarbonyl group.

19. The radiation-sensitive resin composition according to claim 3, wherein the content of the acid generator (B') is from 0.1 to 10 parts by weight for 100 parts by weight of the amount of the polymer (A').

20. The radiation-sensitive resin composition according to claim 3, further comprising a nitrogen-containing organic compound as an acid diffusion control agent.

21. The radiation-sensitive resin composition according to claim 3, wherein the copolymer (A') further comprises a recurring unit (III) which is derived from a monomer having at least two polymerizable carbon—carbon double bonds by cleavage of the carbon—carbon double bonds, wherein the monomer has, in addition to said at least two polymerizable carbon—carbon double bonds, at least one acid-decomposable divalent group of the following formula (3) or (4),

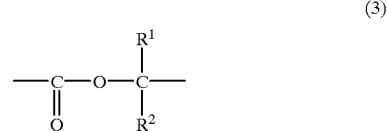

wherein $R^1$ and $R^2$ are individually an alkyl group having 1–5 carbon atoms,
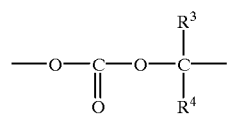
(4)
wherein $R^3$ and $R^4$ are individually an alkyl group having 1–5 carbon atoms,
5. said at least two polymerizable carbon—carbon double bonds being linked via the least one acid-decomposable divalent group of the formula (3) or (4).
* * * * *